US009699568B2

United States Patent
Park et al.

(10) Patent No.: US 9,699,568 B2
(45) Date of Patent: Jul. 4, 2017

(54) PORTABLE PIEZOELECTRIC SPEAKER AND ELECTRONIC DEVICE HAVING THE SAME

(71) Applicant: INNOCHIPS TECHNOLOGY CO., LTD., Ansan-Si, Gyeonggi-Do (KR)

(72) Inventors: In Kil Park, Seongnam-Si (KR); Seong Cheol Park, Ansan-Si (KR); Tae Hyung Noh, Siheung-Si (KR); Hyun Chul Jung, Ansan-Si (KR); Young Sul Kim, Incheon (KR)

(73) Assignee: INNOCHIPS TECHNOLOGIES CO., LTD. (KR)

( * ) Notice: Subject to any disclaimer, the term of this patent is extended or adjusted under 35 U.S.C. 154(b) by 71 days.

(21) Appl. No.: 14/767,284

(22) PCT Filed: Dec. 31, 2013

(86) PCT No.: PCT/KR2013/012404
§ 371 (c)(1),
(2) Date: Aug. 11, 2015

(87) PCT Pub. No.: WO2015/102123
PCT Pub. Date: Jul. 9, 2015

(65) Prior Publication Data
US 2016/0014525 A1    Jan. 14, 2016

(51) Int. Cl.
*H04R 17/00*    (2006.01)
*H04R 7/04*    (2006.01)
(Continued)

(52) U.S. Cl.
CPC ........... *H04R 17/00* (2013.01); *H01L 41/083* (2013.01); *H01L 41/0906* (2013.01);
(Continued)

(58) Field of Classification Search
CPC .. H04R 17/00; H04R 17/005; H04R 2499/11; H04R 2499/15; H04R 7/045;
(Continued)

(56) References Cited

U.S. PATENT DOCUMENTS 7,038,356 B2 * 5/2006 Athanas ................ H04R 17/00
310/311
9,020,174 B2 * 4/2015 Åsnes ................ H04R 25/606
181/129

(Continued)

FOREIGN PATENT DOCUMENTS

CN    101069341 A    11/2007
CN    201903695 U    7/2011
(Continued)

OTHER PUBLICATIONS

International Preliminary Report on Patentability and Written Opinion of PCT/KR2013/012404 mailed Oct. 16, 2014.
(Continued)

*Primary Examiner* — Matthew Eason

(57) ABSTRACT

Disclosed is a portable piezoelectric speaker including a body configured to be coupled to and separated from a rear surface of an electronic device, and a piezoelectric speaker module coupled to a predetermined area of the body, wherein the piezoelectric speaker module includes a piezoelectric device, and a vibration transfer member provided to be in contact with at least one area of the piezoelectric device and to be spaced apart from at least one surface of the piezoelectric device.

22 Claims, 18 Drawing Sheets

(51) Int. Cl.
*H01L 41/083* (2006.01)
*H01L 41/09* (2006.01)

(52) U.S. Cl.
CPC ......... *H04R 7/045* (2013.01); *H04R 2400/03* (2013.01); *H04R 2440/05* (2013.01); *H04R 2499/11* (2013.01)

(58) Field of Classification Search
CPC ............ H04R 2217/00; H04R 2217/01; H04R 2400/03; H04R 9/066
See application file for complete search history.

(56) References Cited

U.S. PATENT DOCUMENTS

| | | | |
|---|---|---|---|
| 9,264,802 B2* | 2/2016 | Ooi | H04R 3/00 |
| 2006/0239479 A1* | 10/2006 | Schobben | H04M 1/0266 |
| | | | 381/306 |
| 2007/0057601 A1* | 3/2007 | Kawase | H04R 17/00 |
| | | | 310/328 |
| 2008/0044042 A1* | 2/2008 | Liu | H04R 9/00 |
| | | | 381/150 |
| 2009/0303839 A1* | 12/2009 | Narayanan | G10K 9/121 |
| | | | 367/164 |
| 2011/0133606 A1* | 6/2011 | Yoshida | H02N 2/004 |
| | | | 310/356 |
| 2015/0117682 A1* | 4/2015 | Fukami | B06B 1/0603 |
| | | | 381/190 |
| 2015/0117683 A1* | 4/2015 | Ozasa | B06B 1/0603 |
| | | | 381/190 |
| 2015/0117684 A1* | 4/2015 | Fukami | H04R 17/00 |
| | | | 381/190 |
| 2015/0126112 A1* | 5/2015 | Park | H02J 7/00 |
| | | | 455/41.1 |
| 2015/0153999 A1* | 6/2015 | Brodkin | B06B 3/00 |
| | | | 700/94 |
| 2015/0187349 A1* | 7/2015 | Schafer | G10K 9/121 |
| | | | 367/189 |
| 2015/0245145 A1* | 8/2015 | Horii | H04R 7/045 |
| | | | 381/98 |
| 2015/0296304 A1* | 10/2015 | Tang | H04R 1/02 |
| | | | 381/334 |
| 2015/0350789 A1* | 12/2015 | Stickland | B06B 1/0666 |
| | | | 381/398 |

FOREIGN PATENT DOCUMENTS

| | | |
|---|---|---|
| JP | 2000333295 A | 11/2000 |
| JP | 2003299194 A | 10/2003 |
| JP | 2004172654 A | 6/2004 |
| JP | 2012204913 A | 10/2012 |
| JP | 20139236 A | 1/2013 |
| JP | 2013232874 A | 11/2013 |
| KR | 20070100611 A | 10/2007 |
| KR | 20120110664 A | 10/2012 |
| KR | 101258108 B1 | 4/2013 |
| KR | 20130098708 A | 9/2013 |
| TW | M454056 U | 5/2013 |
| TW | M455314 U | 6/2013 |
| TW | I403183 B | 7/2013 |
| WO | 2011149304 A2 | 12/2011 |
| WO | 2013022287 A2 | 2/2013 |

OTHER PUBLICATIONS

International Search Report of PCT/KR2013/012404 mailed Oct. 16, 2014.

* cited by examiner

PORTABLE PIEZOELECTRIC SPEAKER AND ELECTRONIC DEVICE HAVING THE SAME

BACKGROUND

The present disclosure relates to a portable piezoelectric speaker, and more particularly, to a portable piezoelectric speaker which is removably coupled to an electronic device to amplify a sound volume of the electronic device.

Recently, downsizing, slimming and weight-reducing is more emphasized in a small portable electronic device that a user may use portably. Further, by adding multi-purpose functions which may be appropriately used in various multimedia environments or internet environments as well as a simple communication function, it is widely used as a smart phone. Particularly, the smart phone has a wider screen in order to enable the smart phone to be more appropriately used in the multimedia environment, and for user's convenience, a touchscreen capable of being driven in a touching manner is universally used in the smart phone.

Meanwhile, in the portable electronic device which may reproduce a multimedia source, its own speaker is not provided due to the downsizing, and even though the speaker is provided therein, a mono-speaker which may reproduce only a minimum sound is installed therein so as to reduce a power consumption. Therefore, in order for the user to appreciate the multimedia source in a sufficient sound volume, it is necessary to connect a separate speaker.

However, since a conventional speaker has a large size, it is difficult for the user to carry it. Further, a separate connection wire is required in order to connect the conventional speaker with the portable electronic device, and also since the user have to separately carry the speaker and the connection wire, inconvenience is weighted on the user. Meanwhile, Korean Patent Publication No. 10-2012-0110664 discloses a portable terminal case capable of providing vibration and sound.

SUMMARY

The present disclosure provides a portable piezoelectric speaker which uses a piezoelectric speaker module, has a small size and thus is easily to carry it.

The present disclosure also provides a portable piezoelectric speaker which is removably coupled with a portable electronic device so as to amplify a sound volume of the portable electronic device.

The present disclosure also provides a portable piezoelectric speaker which is in contact with an object such as a table, while being coupled with a portable electronic device, and thus may amplify a sound volume of the portable electronic device.

In accordance with an exemplary embodiment, a portable piezoelectric speaker includes a body configured to be coupled to and separated from a rear surface of an electronic device, and a piezoelectric speaker module coupled to a predetermined area of the body, wherein the piezoelectric speaker module includes a piezoelectric device, and a vibration transfer member provided to be in contact with at least one area of the piezoelectric device and to be spaced apart from at least one surface of the piezoelectric device.

The body may have the same shape as that of a rear surface cover of the electronic device and is coupled after the rear cover of the electronic device is separated.

An opening may be provided at a predetermined area of the body, and the piezoelectric module may be inserted and coupled into the opening.

The piezoelectric speaker module may further include a connection terminal of which one side is connected with the piezoelectric device, and the other side may be exposed to an outside, and the other side of the connection terminal may be connected with an output terminal provided at the rear surface of the electronic device.

The portable piezoelectric speaker may further include a flip cover provided at one side surface of the body so as to cover a front surface of the electronic device.

The portable piezoelectric speaker may further include a power supplying part provided at one side surface of the body so as to supply power to the piezoelectric speaker module.

The power supplying part may be provided at a second area which extends in a length direction of the electronic device from a first area of the body coupled with the electronic device.

The power supplying part may include a first connector connected with an external power terminal, a battery charged by power supplied through the first connector, a power amplification part configured to amplify power of the battery, and a connection line configured to supply power amplified through the power amplification part to the piezoelectric speaker module.

The portable piezoelectric speaker may further include a circuit board provided between the first connector and the battery, and the power amplification part may be provided on the circuit board.

The portable piezoelectric speaker may further include a second connector provided on the circuit board in an opposite direction to the first connector so as to be connected with the electronic device.

The portable piezoelectric speaker may further include a flip cover provided at one side surface so as to cover a front surface of the electronic device and a front surface of the power supplying part.

The portable piezoelectric speaker may further include a battery provided at a predetermined area of the rear surface of the electronic device so as to supply power to the piezoelectric speaker module and the electronic device.

The portable piezoelectric speaker may further include a power amplification part provided at one side of the battery so as to amplify power supplied to the piezoelectric speaker module.

In accordance with another exemplary embodiment, a portable piezoelectric speaker includes a piezoelectric speaker module inserted into a predetermined area of a rear surface of an electronic device, and a body provided to be coupled with and separated from a rear surface of the electronic device, wherein the piezoelectric speaker module comprises a piezoelectric device, and a vibration transfer member provided to be in contact with at least one area of the piezoelectric device and to be spaced apart from at least one surface of the piezoelectric device.

An insertion protrusion may be provided at a predetermined area of the piezoelectric speaker module, and an insertion groove may be provided at the body corresponding to the insertion protrusion, and the insertion protrusion may be inserted into the insertion groove.

In accordance with yet another exemplary embodiment, a portable piezoelectric speaker includes lower and upper vibration transfer bodies having a predetermined space therein, a piezoelectric device provided at the space in the vibration transfer bodies, a first connector provided on the piezoelectric device so as to be connected to an external power terminal, a battery charged by power supplied through the first connector, and a power amplification part configured to amplify power of the battery and supply the amplified power to the piezoelectric device, wherein the lower vibration transfer member is in contact with at least one area of the piezoelectric device and spaced apart from one surface of the piezoelectric device.

The portable piezoelectric speaker may further include a circuit board provided between the first connector and the battery, and the power amplification part may be provided on the circuit board.

The portable piezoelectric speaker may further include a second connector provided on the circuit board so as to be connected with the electronic device.

The piezoelectric device may include a vibration generating layer which is not polarized, at least two or more piezoelectric layers which are respectively provided at upper and lower sides of the vibration generating layer so as to be polarized and stacked in a thickness direction, and a plurality of electrodes which are provided between the vibration generating layer and the piezoelectric layers, and each of the piezoelectric layers are stacked so that a polarized direction thereof may be opposite to each other.

The portable piezoelectric speaker may further include at least one via plug penetrating a predetermined area of each of the vibration generating layer and the piezoelectric layers, and electrodes which receive the same polar voltage may be connected through the via plug.

The electrodes may be exposed to one side surface and the other side surface of the piezoelectric device and may be connected by a side surface electrode provided at a side surface of the piezoelectric device.

The vibration transfer member may be provided so that a distance from the piezoelectric device is gradually increased, reduced or uniformly maintained from an edge thereof toward a central portion.

The other side of the piezoelectric speaker module may be in contact with a vibration amplification objection, and a sound pressure and an output are amplified.

In accordance with still another exemplary embodiment, a electronic device includes a piezoelectric speaker module coupled to a rear surface thereof, wherein the piezoelectric speaker module comprises a piezoelectric device, and a vibration transfer member which is in contact with at least one area of the piezoelectric device and spaced apart from at least one surface of the piezoelectric device.

The vibration transfer member may be provided so that a distance from the piezoelectric device is gradually increased, reduced or uniformly maintained from an edge thereof toward a central portion.

The other side of the piezoelectric speaker module may be in contact with a vibration amplification objection, and a sound pressure and an output are amplified.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
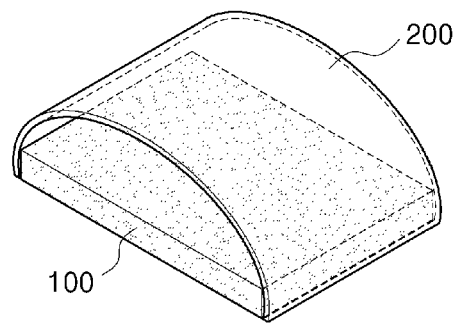
FIGS. 1 to 4 are schematic views of a piezoelectric speaker module in accordance with exemplary embodiments.

FIG. 1 is a schematic view of a piezoelectric speaker module in accordance with an exemplary embodiment.

Referring to FIG. 1, a piezoelectric speaker module in accordance with an exemplary embodiment includes a piezoelectric device 100, and a vibration transfer plate 200 which extends from at least two side surfaces of the piezoelectric device 100 so as to be spaced apart from one surface of the piezoelectric device 100. In the piezoelectric speaker module, a sound is amplified in a space between the piezoelectric device 100 and the vibration transfer plate 200 and then output.

The piezoelectric device 100 may have, for example, a quadrangular plate shape having a predetermined thickness. That is, the piezoelectric device 100 may have two surfaces opposite to each other, i.e., upper and lower surfaces, and four side surfaces defined along edges of the upper and lower surfaces. Of course, the piezoelectric device 100 may have various shapes, such as a circular shape, an elliptical shape and a polygonal shape, other than the quadrangular shape. The piezoelectric device 100 may include a substrate, and a piezoelectric layer provided on at least one surface of the substrate. For example, the piezoelectric device 100 may be a bimorph type in which the piezoelectric layer is provided on both surfaces of the substrate, or may be a unimorph type in which the piezoelectric layer is provided on one surface of the substrate. At least one piezoelectric layer may be provided, and a plurality of piezoelectric layers may be stacked. Further, an electrode may be provided at each of upper and lower sides of the piezoelectric layer. Here, for example, the piezoelectric layer may be made of a PZT (Pb, Zr, Ti), NKN (Na, Km Nb), or BNT (Bi, Na, Ti)-based piezoelectric material. Further, the piezoelectric layer may be polarized in different directions from each other and stacked. That is, when the plurality of piezoelectric layers are provided on one surface of the substrate, an opposite polarization of each piezoelectric layer may be alternately provided. Meanwhile, the substrate may be made of a material which generates vibration while the piezoelectric layers are maintained in a stacked structure, for example, such as a metallic material and a plastic material. An electrode terminal to which a driving voltage is applied may be provided at least one end of the substrate. However, the piezoelectric device 100 may not use the piezoelectric layer and the substrate which is a foreign substance. That is, the piezoelectric device 100 may include a piezoelectric layer which is not polarized and is provided at a central portion thereof, and a plurality of piezoelectric layers which are polarized in the different directions from each other and stacked at upper and lower portions thereof. Various exemplary embodiments of the piezoelectric device 100 including the non-polarized piezoelectric layer and the plurality of polarized piezoelectric layers will be described later with reference to FIGS. 5 to 7.

The vibration transfer plate 200 may be provided to be spaced apart from at least one surface of the piezoelectric device 100 in a predetermined distance. For example, edges of the vibration transfer plate 200 may be adhered to two opposite side surfaces of the piezoelectric device 100, and the rest areas of the vibration transfer plate 200 may be spaced apart from the one surface of the piezoelectric device 100. At this time, the vibration transfer plate 200 may have, for example, a dome shape in which a distance from the piezoelectric device 100 is gradually increased from the edges of the piezoelectric device 100 toward the central portion thereof. Of course, the vibration transfer plate 200 may have the dome shape of which all of four edges are adhered to the side surfaces of the piezoelectric device 100. To this end, for example, the vibration transfer plate 200 may be provided to be larger than the piezoelectric device 100 according to a shape of the piezoelectric device 100. That is, the vibration transfer plate 200 may have a quadrangular shape following the shape of the piezoelectric device 100, and may be provided to be larger than the piezoelectric device 100 with consideration for a width of an area thereof adhered to the side surface of the piezoelectric device 100 and the distance spaced apart from the one surface of the piezoelectric device 100. A space between the piezoelectric device 100 and the vibration transfer plate 200 may be a resonant cavity. The piezoelectric speaker module may be provided to be in contact with an electronic device such as a smart phone, and a side of the piezoelectric device 100 may be in contact with a main body of the electronic device. Further, the piezoelectric speaker module may be provided to be coupled with and separated from the electronic device. For example, a body having the same shape as that of a battery cover covering a rear surface of the electronic device may be provided, and the piezoelectric speaker module may be fastened to a predetermined area of the body, and then the body may be installed at the rear surface of the electronic device. Further, a groove is provided in a predetermined area of the rear surface of the electronic device, and the piezoelectric speaker module may be installed in the groove. Of course, the piezoelectric speaker module may be connected to the electronic device through a cable. In the piezoelectric speaker module, the vibration transfer plate 200 may serve to transfer vibration and resonance of the piezoelectric device 100 to an outside. Further, when a side of the vibration transfer plate 200 is in contact with a vibration amplification object such as a table and a box, it is possible to more amplify an output and a sound pressure and then output them. Here, the vibration transfer plate 200 may be made of a metallic material, a plastic material or the like, and may have at least a double structure in which different kinds of materials are stacked, and may be made of a material having a flexible property, for example, a resin such as PET. Meanwhile, the spaced distance between the piezoelectric device 100 and the vibration transfer plate 200 may be changed according to a size of the piezoelectric device 100, a receiving space of the electronic device in which the piezoelectric speaker module is received, the desired output and sound pressure, or the like.

Figure 2:
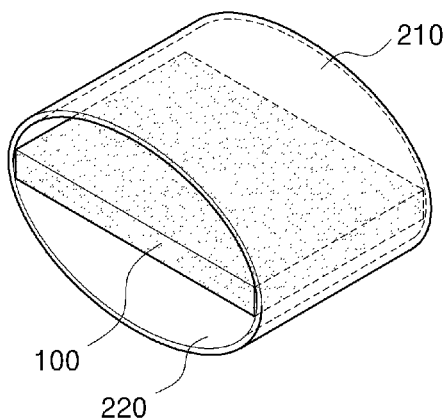
Figure 3:
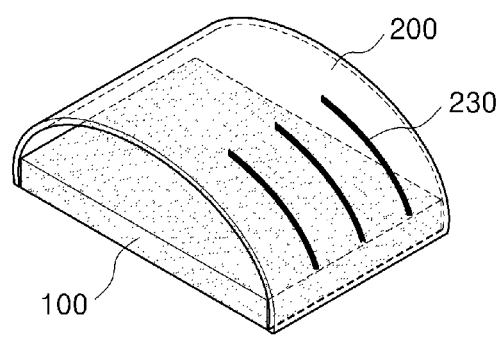
Figure 4:
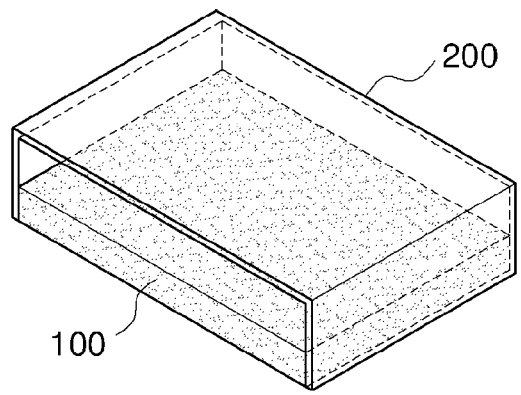

FIGS. 2 to 4 are schematic views of the piezoelectric speaker module in accordance with other exemplary embodiments. As illustrated in FIG. 2, the piezoelectric speaker module may include a piezoelectric device 100, a first vibration transfer plate 210 having a dome shape which extends from two side surfaces of the piezoelectric device 100 so as to be spaced apart from an upper surface of the piezoelectric device 100, and a second vibration transfer plate 210 having the dome shape which extends from the two side surfaces of the piezoelectric device 100 so as to be spaced apart from a lower surface of the piezoelectric device 100. That is, the piezoelectric speaker module in accordance with another exemplary embodiment may include the first and second vibration transfer plates 210 and 220 which are provided to be spaced apart from the upper and lower surfaces of the piezoelectric device 100. Here, the first and second vibration transfer plates 210 and 220 may be adhere to the same side surfaces of the piezoelectric device 100, or may be adhered to different side surfaces thereof. That is, edges of the second vibration transfer plate 220 may be adhered to the two side surfaces of the piezoelectric device 100 orthogonal to another side surfaces thereof to which the first vibration transfer plate 210 is adhered. Of course, the edges of the first and second vibration transfer plates 210 and 220 may be provided to be adhered to all of the side surfaces of the piezoelectric device 100.

Further, as illustrated in FIG. 3, the piezoelectric speaker module may include a piezoelectric device 100, a vibration transfer plate 200 having the dome shape which extends from at least two side surfaces of the piezoelectric device 100 so as to be spaced apart from the upper surface of the piezoelectric device 100, and at least one pattern 230 provided at a predetermined area of the vibration transfer plate 200. The pattern 230 may be defined by cutting or removing at least a part of the vibration transfer plate 200, or by attaching a material, which is the same as or different from that of the vibration transfer plate 200, on the vibration transfer plate 200. The pattern 230 may be defined to have a predetermined length from an area which is in contact with the piezoelectric device 100. Further, the pattern 230 may be provided at least one side of the vibration transfer plate 200.

And as illustrated in FIG. 4, the piezoelectric speaker module may include a piezoelectric device 100, and a vibration transfer plate 200 which extends from at least two side surfaces of the piezoelectric device 100 so as to be spaced apart from at least one surface of the piezoelectric device 100 in a uniform distance. That is, in each of the piezoelectric speaker modules in accordance with the exemplary embodiments as illustrated in FIGS. 1 to 3, the vibration transfer plate 200 has the dome shape in which a distance from at least one surface of the piezoelectric device 100 is gradually increased from the edges of the piezoelectric device 100 toward a central portion thereof. However, in the piezoelectric speaker module of FIG. 4, the spaced distance of the vibration transfer plate 200 is uniform over entire areas thereof. Further, although not illustrated, the spaced distance between the piezoelectric device 100 and the vibration transfer plate 200 may be increased from the two edges of the piezoelectric device 100 to a predetermined area thereof and then may be uniform at the other areas. As a result, in each of the piezoelectric speaker modules of the exemplary embodiments, the vibration transfer plate 200 is defined to be spaced apart from the at least one surface of the piezoelectric device 100 in the predetermined distance. Meanwhile, in the above descriptions, the edges of the vibration transfer plate 200 are in contact with the side surfaces of the piezoelectric device 100. However, the edges of the vibration transfer plate 200 may be in contact with edges of one surface of the piezoelectric device 100.

Meanwhile, in each of the piezoelectric speaker modules in accordance with the exemplary embodiments as illustrated in FIGS. 1 to 3, the vibration transfer plate 200 is defined so that the distance from the piezoelectric device 100 is gradually increased from the two edges of the piezoelectric device 100 toward the central portion thereof, but the vibration transfer plate 200 may be defined so that the distance is gradually reduced from the two edges of the piezoelectric device 100 toward the central portion thereof. Further, the distance between the piezoelectric device 100 and the vibration transfer plate 200 at least one area may be different from that at least the other area. That is, the vibration transfer plate 200 may be defined to have a predetermined curve and then adhered to the edges of the piezoelectric device 100.

Figure 5:
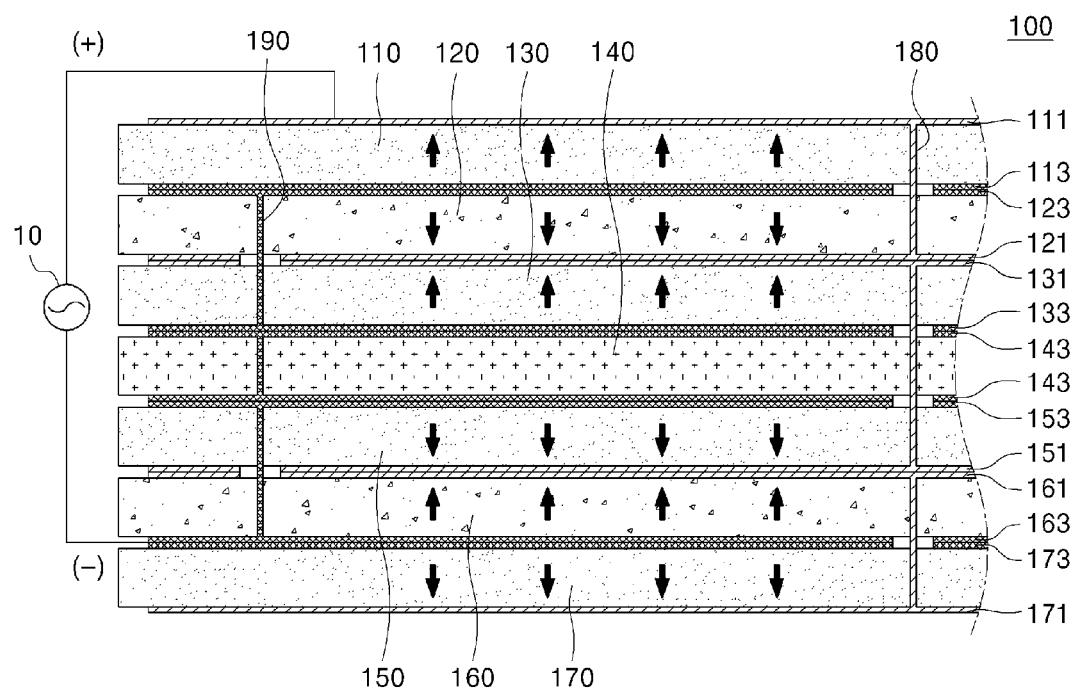
FIGS. 5 to 7 are cross-sectional views of a piezoelectric device applied to the piezoelectric speaker module in accordance with exemplary embodiments.

FIG. 5 is a cross-sectional view of the piezoelectric device in accordance with one exemplary embodiment.

Referring to FIG. 5, the piezoelectric device 100 in accordance with one exemplary embodiment may include first to third piezoelectric layers 110, 120 and 130 which are polarized and stacked in a thickness direction, a vibration generating layer 140 which is provided at a lower side of the third piezoelectric layer 130 so as not to be polarized, and fourth to sixth piezoelectric layers 150, 160 and 170 which are provided at a lower side of the vibration generating layer 140 so as to be polarized and stacked in a thickness direction. That is, in the piezoelectric device 100 in accordance with one exemplary embodiment, the first to third piezoelectric layers 110, 120 and 130 are disposed on the vibration generating layer 140, and the fourth to sixth piezoelectric layers 150, 160 and 170 are disposed under the vibration generating layer 140.

Each of the first to third piezoelectric layers 110, 120 and 130 which are polarized in the thickness direction so as to have a piezoelectric property may be a circular or quadrangular thin substrate. The first to third piezoelectric layers 110, 120 and 130 are not limited thereto, but may be modified to have the piezoelectric property which may be applied to the piezoelectric speaker. The first to third piezoelectric layers 110, 120 and 130 are stacked so that polarized directions of the first to third piezoelectric layers 110, 120 and 130 are opposite to each other. For example, the first and third piezoelectric layers 110 and 130 may be polarized in an opposite direction to the vibration generating layer 140, i.e., in an upward direction of the vibration generating layer 140, and the second piezoelectric layer 120 may be polarized toward the vibration generating layer 140, i.e., in a downward direction of the vibration generating layer 140. The first piezoelectric layer 110 may have a 1a-th electrode 111 provided on an upper surface thereof and a 1b-th electrode 113 provided on a lower surface thereof, and may be polarized from the 1b-th electrode 113 toward the 1a-th electrode 111. The second piezoelectric layer 120 may have a 2b-th electrode 123 provided on an upper surface thereof so as to be in contact with the 1b-th electrode 113 of the first piezoelectric layer 110 and a 2a-th electrode 121 provided on a lower surface thereof, and may be polarized from the 2b-th electrode 123 toward the 2a-th electrode 121. At this time, the 1b-th electrode 113 and the 2b-th electrode 123 may be integrally provided. The third piezoelectric layer 130 may have a 3a-th electrode 131 provided on an upper surface thereof so as to be in contact with the 2a-th electrode 121 of the second piezoelectric layer 120 and a 3b-th electrode 133 provided on a lower surface thereof, and may be polarized from the 3b-th electrode 133 toward the 3a-th electrode 131. At this time, the 2a-th electrode 121 and the 3a-th electrode 131 may be integrally provided.

The vibration generating layer 140 may be a ceramic plate which is not polarized in the thickness and thus does not have the piezoelectric property, and may serve to cause or amplify generation of the vibration at the third and fourth piezoelectric layers 130 and 150. The vibration generating layer 140 may have a pair of electrodes 14 provided on upper and lower surfaces thereof so as to be electrically connected with the 3b-th electrode 133 and a 4b-th electrode 153. At this time, the 3b-th electrode 133 and the electrode 143 provided on the upper surface of the vibration generating layer 140 may be integrally provided.

Each of the fourth to sixth piezoelectric layers 150, 160 and 170 which are polarized in the thickness direction so as to have the piezoelectric property may be the circular or quadrangular thin substrate. The fourth to sixth piezoelectric layers 150, 160 and 170 are not limited thereto, but may be modified to have the piezoelectric property which may be applied to the piezoelectric speaker. The sixth piezoelectric layers 150, 160 and 170 are stacked so that polarized directions of the sixth piezoelectric layers 150, 160 and 170 are opposite to each other. For example, the fourth and sixth piezoelectric layers 150 and 170 may be polarized in the opposite direction to the vibration generating layer 140, i.e., in the downward direction of the vibration generating layer 140, and the fifth piezoelectric layer 160 may be polarized toward the vibration generating layer 140, i.e., in the upward direction of the vibration generating layer 140. The fourth piezoelectric layer 150 may have a 4b-th electrode 153 provided on an upper surface thereof so as to be in contact with the electrode 143 of the vibration generating layer 140 and a 4a-th electrode 151 provided on a lower surface thereof, and may be polarized from the 4b-th electrode 153 toward the 4a-th electrode 151. At this time, the electrode 143 provided on the lower surface of the vibration generating layer 140 and the 4b-th electrode 153 of the fourth piezoelectric layer 150 may be integrally provided. The fifth piezoelectric layer 160 may have a 5a-th electrode 161 provided on an upper surface thereof so as to be in contact with the 4a-th electrode 151 of the fourth piezoelectric layer 150 and a 5b-th electrode 163 provided on a lower surface thereof, and may be polarized from the 5b-th electrode 163 toward the 5a-th electrode 161. At this time, the 4a-th electrode 151 and the 5a-th electrode 161 may be integrally provided. The sixth piezoelectric layer 170 may have a 6b-th electrode 173 provided on an upper surface thereof so as to be in contact with the 5b-th electrode 163 of the fifth piezoelectric layer 160 and a 6a-th electrode 171 provided on a lower surface thereof, and may be polarized from the 6b-th electrode 173 toward the 6a-th electrode 171. At this time, the 5b-th electrode 163 and the 6b-th electrode 173 may be integrally provided.

Here, the 1a-th, 2a-th, 3a-th, 4a-th, 5a-th and 6a-th electrodes 111, 121, 131, 151, 161 and 171 of the first to sixth piezoelectric layers 110, 120, 130, 150, 160 and 170 are electrically connected with each other, and the 1b-th, 2b-th, 3b-th, 4b-th, 5b-th and 6b-th electrodes 113, 123, 133, 153, 163 and 173 thereof are also electrically connected with each other. Further, the 1a-th, 2a-th, 3a-th, 4a-th, 5a-th and 6a-th electrodes 111, 121, 131, 151, 161 and 171 and the 1b-th, 2b-th, 3b-th, 4b-th, 5b-th and 6b-th electrodes 113, 123, 133, 153, 163 and 173 are electrically insulated from each other. In order to electrically connects the 1a-th, 2a-th, 3a-th, 4a-th, 5a-th and 6a-th electrodes 111, 121, 131, 151, 161 and 171 of the first to sixth piezoelectric layers 110, 120, 130, 150, 160 and 170 with each other, a first via plug 180 in which a conductive material is buried in a first via hole penetrating the first to sixth piezoelectric layers 110, 120, 130, 150, 160 and 170 and the vibration generating layer 140 is provided. Further, in order to electrically connects the 1b-th, 2b-th, 3b-th, 4b-th, 5b-th and 6b-th electrodes 113, 123, 133, 153, 163 and 173 of the first to sixth piezoelectric layers 110, 120, 130, 150, 160 and 170 with each other, a second via plug 190 in which a conductive material is buried in a second via hole penetrating the second to fifth piezoelectric layers 120, 130, 150 and 160 and the vibration generating layer 140. Here, in order to prevent short circuit of the a-th electrodes and the b-th electrodes, the 1b-th, 2b-th, 3b-th, 4b-th, 5b-th and 6b-th electrodes 113, 123, 133, 153, 163 and 173 are not provided at each area of the piezoelectric layers 110 to 170 in which the first via plug 180 is defined, and the 2a-th, 3a-th, 4a-th and 5a-th electrodes 121, 131, 151 and 161 are not provided at each area of the piezoelectric layers 110 to 170 in which the second via plug 190 is defined.

In the piezoelectric device 100, for example, a (+)-pole of a power supplying means 10 is connected to the 1a-th electrode 111, and a (−)-pole thereof is connected to the 6b-th electrode 173, and thus power is supplied. That is, (+)-power is applied to the 1a-th, 2a-th, 3a-th, 4a-th, 5a-th and 6a-th electrodes 111, 121, 131, 151, 161 and 171, and (−)-power is applied to the 1b-th, 2b-th, 3b-th, 4b-th, 5b-th and 6b-th electrodes 113, 123, 133, 153, 163 and 173.

Figure 6:
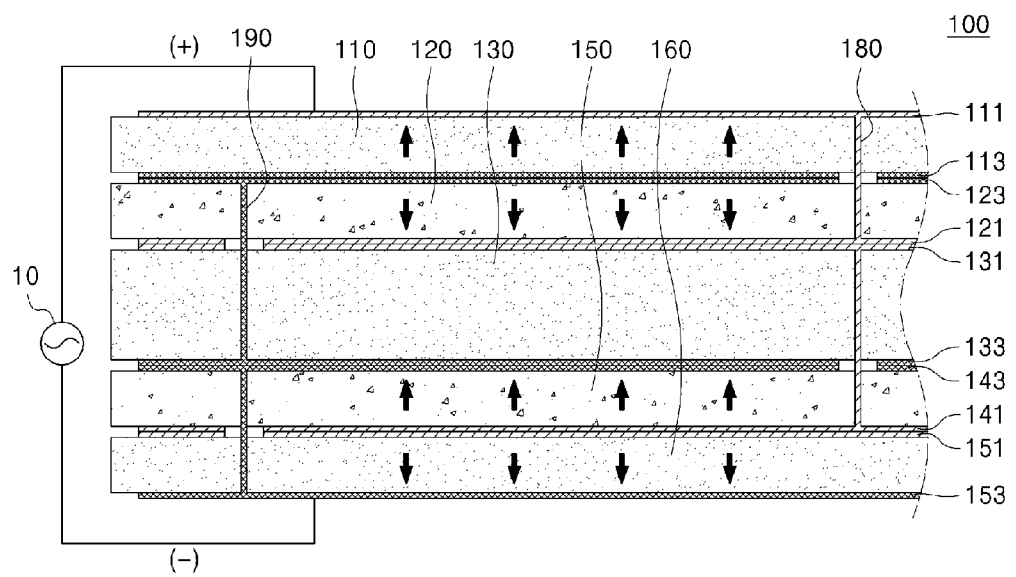

FIG. 6 is a cross-sectional view of the piezoelectric device in accordance with another exemplary embodiment.

Referring to FIG. 6, the piezoelectric device in accordance with another exemplary embodiment may include first to fifth piezoelectric layers 110, 120, 130, 150 and 160 which are polarized and stacked in a thickness direction. A thickness of the third piezoelectric layer 130 is thicker than that of each of the first, second, fourth and fifth piezoelectric layers 110, 120, 150 and 160.

Configurations and shapes of the first to fifth piezoelectric layers 110, 120, 130, 150 and 160 correspond to those of the first to fifth piezoelectric layers 110, 120, 130, 150 and 160 in the one exemplary embodiment. However, in the exemplary embodiment, the thickness of the third piezoelectric layer 130 is provided to be thicker than that of each of the first, second, fourth and fifth piezoelectric layers 110, 120, 150 and 160. Since the thickness of the third piezoelectric layer 130 is provided to be thicker than that of each of the first, second, fourth and fifth piezoelectric layers 110, 120, 150 and 160, a polarized state of the third piezoelectric layer 130 is maintained in an insufficient state, compared to the polarized state of each of the other piezoelectric layers 110, 120, 150 and 160, and thus polarization vibration is caused due to a difference in the polarized state.

Figure 7:
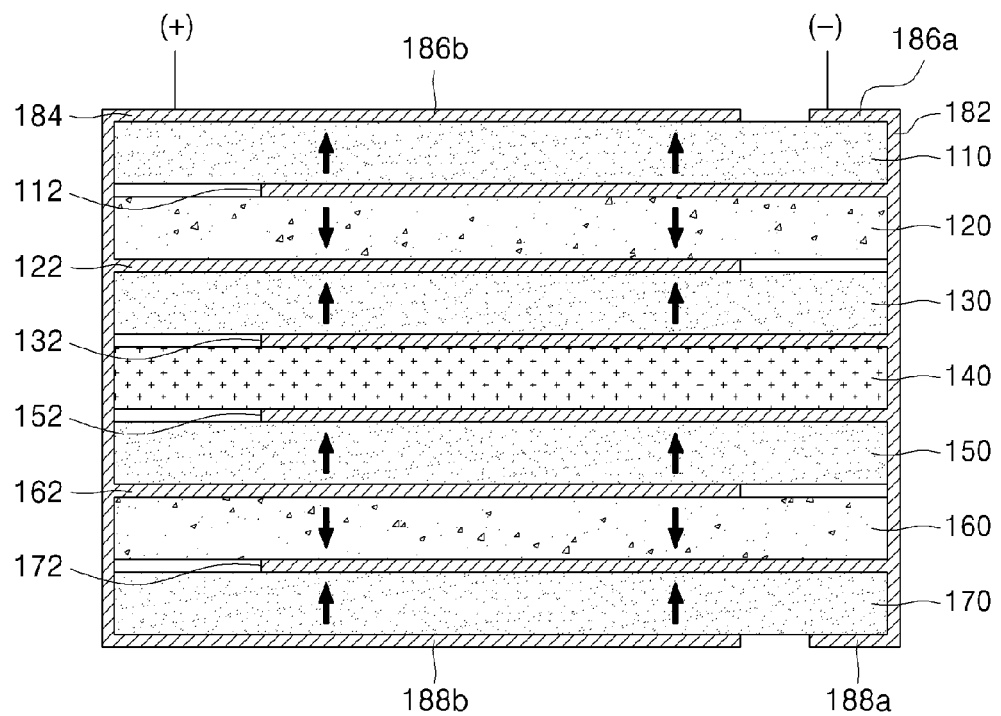

FIG. 7 is a cross-sectional view of the piezoelectric device in accordance with yet another exemplary embodiment.

Referring to FIG. 7, the piezoelectric device 100 in accordance with yet another exemplary embodiment may include first to third piezoelectric layers 110, 120 and 130 which are polarized and stacked in a thickness direction, a vibration generating layer 140 which is provided at a lower side of the third piezoelectric layer 130 so as not to be polarized, and fourth to sixth piezoelectric layers 150, 160 and 170 which are provided at a lower side of the vibration generating layer 140 so as to be polarized and stacked in a thickness direction. Further, the piezoelectric device 100 may include a plurality of internal electrodes 112, 122, 132, 152, 162 and 172 which are respectively among the piezoelectric layers 110 to 170 in a multi-layered body in which the plurality of piezoelectric layers 110 to 170 are stacked. The internal electrodes 112, 122, 132, 152, 162 and 172 are alternately exposed to both side surfaces of the multi-layered body. Further, a first cross-sectional electrode 182 is provided at one side surface of the multi-layered body and connected with the internal electrodes 112, 132, 152 and 172 which are exposed to the one side surface of the multi-layered body, and a second cross-sectional electrode 184 is provided at the other side surface of the multi-layered body and connected with the internal electrodes 122 and 162 which are exposed to the other side surface of the multi-layered body. A first upper surface electrode 186a connected with the first cross-sectional electrode 182 and a second upper surface electrode 186b connected with the second cross-sectional electrode 182 are provided on an upper surface of the multi-layered body so as to be spaced apart from each other. A terminal is provided on each of the first and second upper surface electrodes 186a and 186b so as to be connected to an outside.

The piezoelectric device in accordance with yet another exemplary embodiment has the same structure as that of the piezoelectric device in the one exemplary embodiment, but there is a difference in that the internal electrodes are exposed to the outside and connected with the cross-sectional electrodes. That is, the piezoelectric device in the one exemplary embodiment has the first and second via holes penetrating the plurality of piezoelectric layers and the electrodes are connected with each other through the via holes. However, in the piezoelectric device in accordance with yet another exemplary embodiment has the same structure, the internal electrodes 112, 122, 132, 152, 162 and 172 are alternately exposed to both side surfaces of the multi-layered body, and the first and second cross-sectional electrodes 182 and 184 are connected with the internal electrodes 112, 122, 132, 152, 162 and 172 at the one side surface and the other side surface of the multi-layered body.

Figure 8:
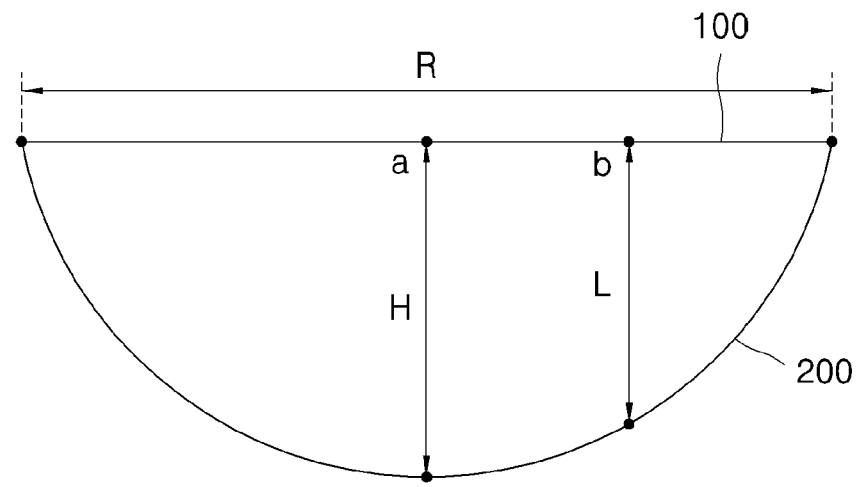
FIG. 8 is a schematically cross-sectional view of a piezoelectric speaker module in accordance with one exemplary embodiment.

FIG. 8 is a schematically cross-sectional view of a piezoelectric speaker module in accordance with one exemplary embodiment, which is to explain characteristics of a resonant frequency and a sound pressure according to a shape of the vibration transfer plate 200. As illustrated in FIG. 8, the vibration transfer plate 200 may have, for example, the dome shape in which the distance from the piezoelectric device 100 is gradually increased from the edges of the piezoelectric device 100 toward the central portion thereof. At this time, while changing a diameter R of the piezoelectric device 100, a first distance H between the central portion a of the piezoelectric device 100 and the vibration transfer plate 200, and a second distance L between the vibration transfer plate 200 and a ½ point b between the central portion a of the piezoelectric device 100 and the edge thereof, the resonant frequency and the sound pressure are measured and shown in the following tables. That is, Table 1, Table 2 and Table 3 show the resonant frequency and the sound pressure, while the diameter R, the first distance H and the second distance L are changed.

TABLE 1

| No. | R (mm) | H (mm) | Resonant frequency (kHz) | Sound pressure (dB) |
|---|---|---|---|---|
| 1 | 25 | 0.5 | 0.61 | 88 |
| 2 | 30 | 0.5 | 0.53 | 83 |
| 3 | 35 | 0.5 | 0.40 | 80 |

TABLE 2

| No. | R (mm) | H (mm) | Resonant frequency (kHz) | Sound pressure (dB) |
|---|---|---|---|---|
| 1 | 25 | 0.5 | 0.61 | 88 |
| 2 | 25 | 1 | 0.67 | 84 |
| 3 | 25 | 2 | 0.75 | 82 |

TABLE 3

| No. | H (mm) | L (mm) | Resonant frequency (kHz) | Sound pressure (dB) |
|---|---|---|---|---|
| 1 | 0.5 | 0.2 | 0.65 | 87 |
| 2 | 0.5 | 0.3 | 0.61 | 88 |
| 3 | 0.5 | 0.5 | 0.59 | 86 |

As shown in Table 1, as the diameter R of the piezoelectric device 100 is increased, the resonant frequency is lowered and the sound pressure is reduced. Further, as shown in Table 2, as the first distance H between the central portion of the piezoelectric device 100 and the vibration transfer plate 200 is increased, the resonant frequency is increased and the sound pressure is reduced. And as shown in Table 3, as the second distance L between the vibration transfer plate 200 and a ½ point b between the central portion a of the piezoelectric device 100 is increased, the resonant frequency and the sound pressure are reduced. Therefore, the shapes of the piezoelectric device 100 and the vibration transfer plate 100 may be controlled in order to obtain a desired resonant frequency and sound pressure.

Meanwhile, in the piezoelectric speaker module in accordance with the exemplary embodiments, the vibration transfer plate 200 is provided to be spaced apart from the at least one surface of the piezoelectric device 100. However, since the vibration transfer plate 200 serves to provide a resonant space between the vibration transfer plate 200 and the piezoelectric device 100, the piezoelectric speaker module may be embodied by that various materials or structures which may provide the resonant space between the vibration transfer plate 200 and the piezoelectric device 100 is adhered to the piezoelectric device 100. The piezoelectric speaker module may be provided a body having the same shape as that of a rear surface cover covering a rear surface of the portable electronic device such as the smart phone, and thus may embody a portable piezoelectric speaker, and the body may be removably coupled to the rear surface of the electronic device. Hereinafter, various exemplary embodiments of the portable piezoelectric speaker using the piezoelectric speaker module will be described.

Figure 9:
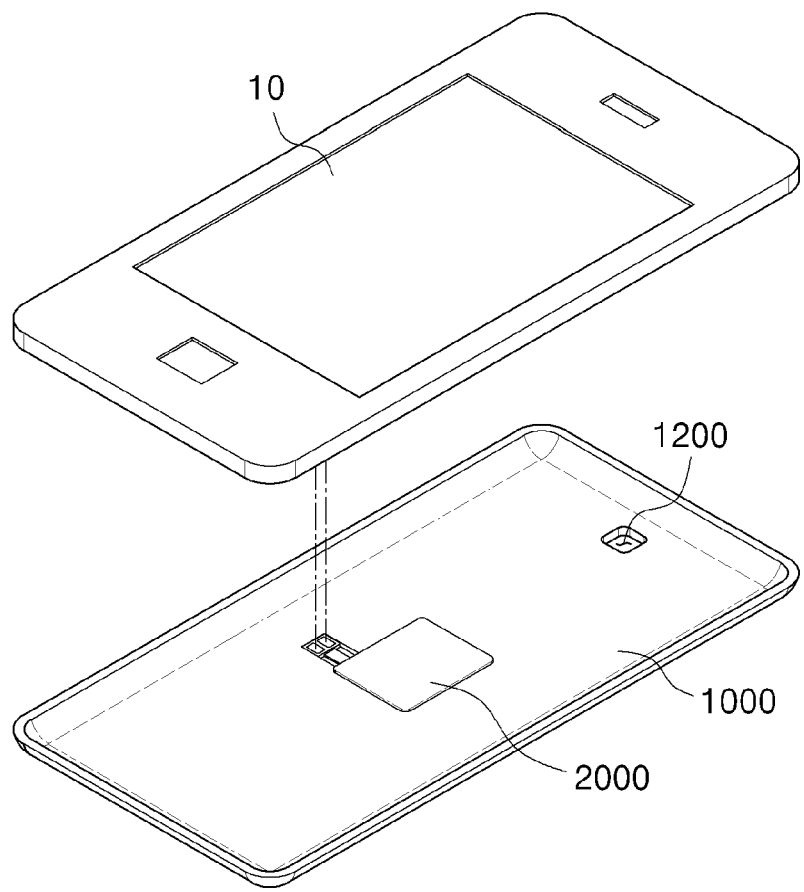
FIGS. 9 to 14 are schematic views of a portable piezoelectric speaker in accordance with one exemplary embodiment.
Figure 10:
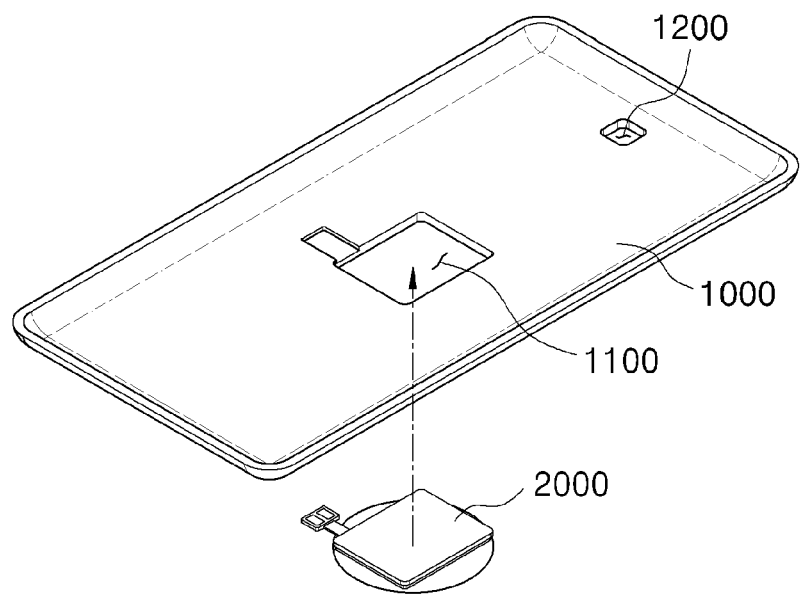
Figure 11:
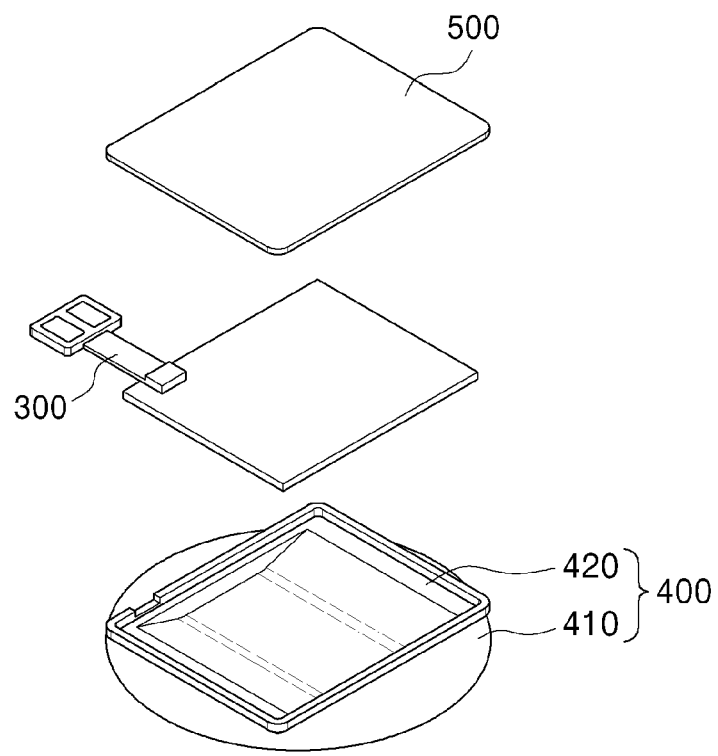
Figure 12:
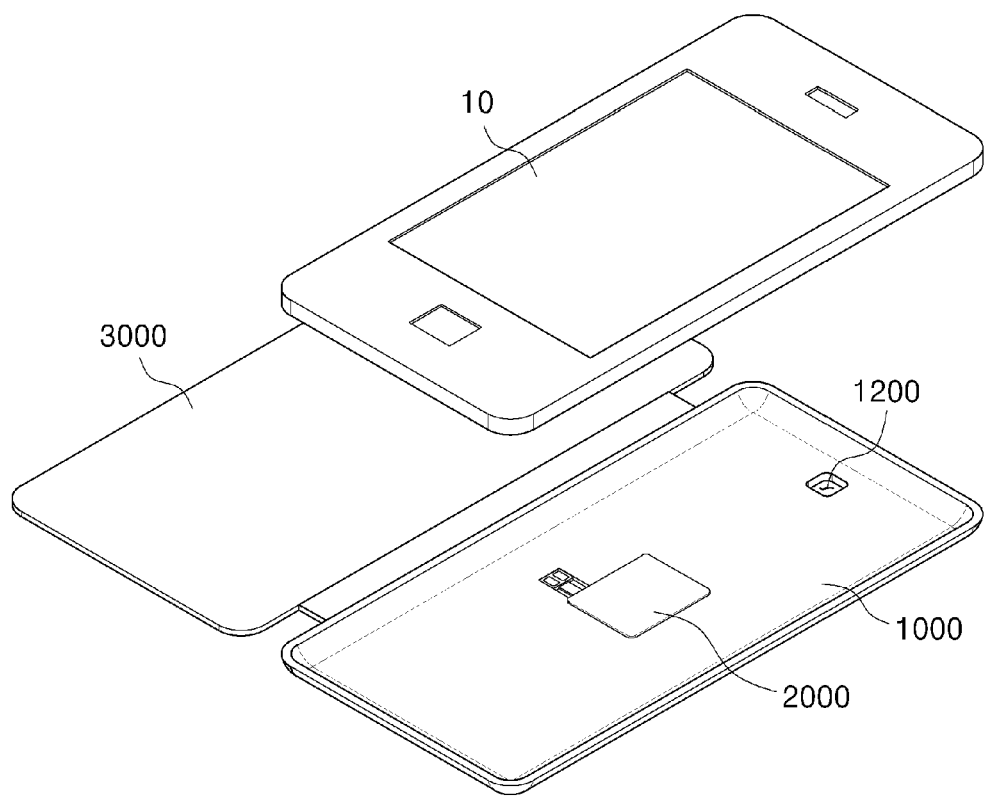
Figure 13A:
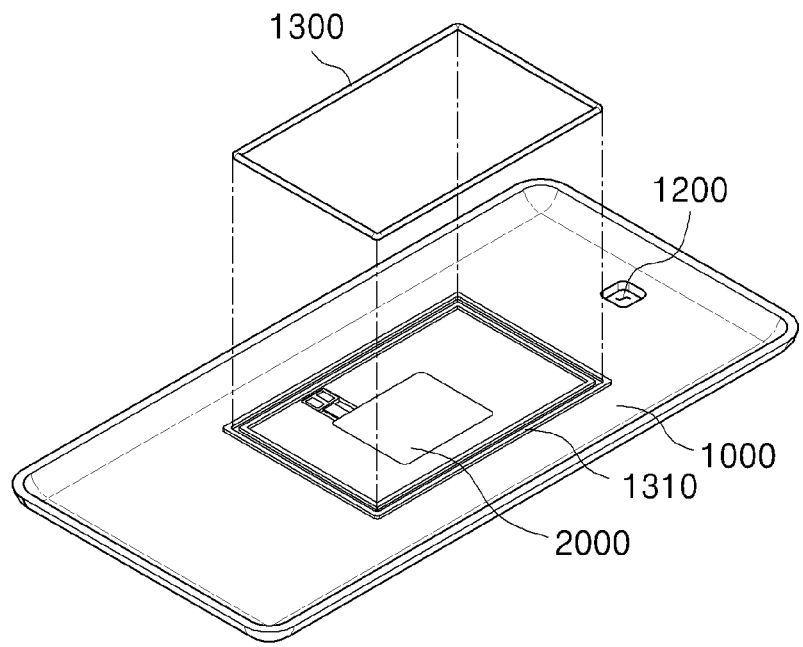
Figure 13B:
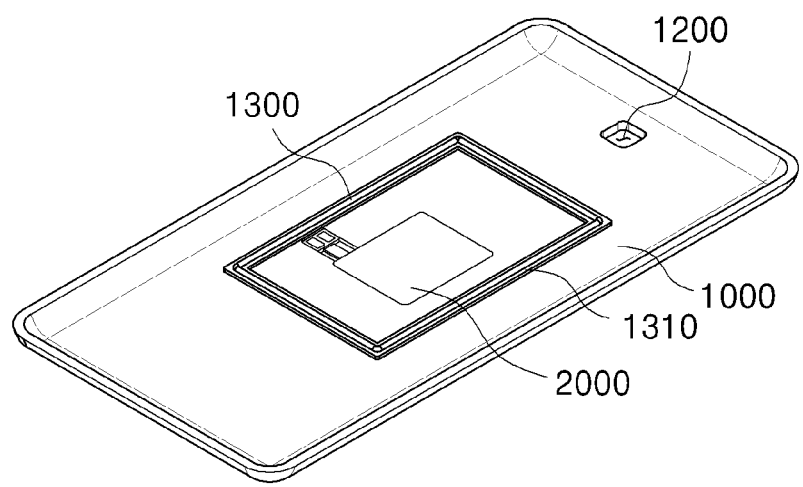
Figure 14:
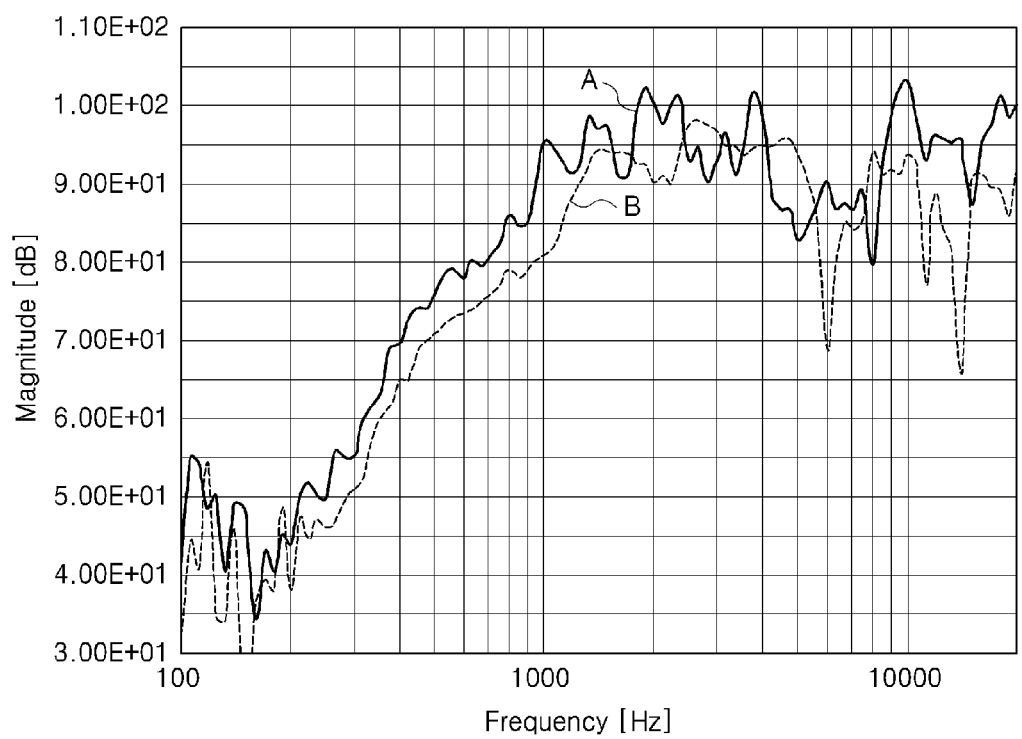

FIGS. 9 to 14 are schematic views of a portable piezoelectric speaker in accordance with one exemplary embodiment, which illustrates the portable piezoelectric speaker that is integrally provided with the rear surface cover of the electronic device. FIG. 9 is a front perspective view of the portable piezoelectric speaker in accordance with one exemplary embodiment, and FIG. 10 is a schematic view to explain a coupling manner between the body of the portable piezoelectric speaker and the piezoelectric speaker module. Further, FIG. 11 is an exploded perspective view of the piezoelectric speaker module, and FIG. 12, FIG. 13A and FIG. 13B are schematic views of the portable piezoelectric speaker in accordance with modified embodiments of the one exemplary embodiment. Further, FIG. 14 is a graph comparing properties of the portable piezoelectric speaker of FIG. 13A and FIG. 13B.

Referring to FIGS. 9 to 13B, the portable piezoelectric speaker in accordance with one exemplary embodiment may include a body 1000 which is coupled to a rear surface of an electronic device 10, and a piezoelectric speaker module 2000 which is provided at an area of the body 1000 and connected with the electronic device 10. The body 1000 to which the piezoelectric speaker module 2000 is provided may be coupled after the rear cover covering a rear surface of the electronic device 10 is separated. Of course, the body 1000 may be provided to cover the rear surface of the electronic device 10. Further, as illustrate in FIG. 12, the portable piezoelectric speaker in accordance with one exemplary embodiment may further include a flip cover 3000 which is provided at one side surface of the body 1000 so as to have a size capable of covering an entire surface of the electronic device 10 and thus to cover the entire surface of the electronic device 10.

First of all, the electronic device 10 applied to the exemplary embodiment may include a portable terminal such as a tablet PC and a smart phone, and in the exemplary embodiment, the smart phone will be described as an example. The electronic device 10 may have a quadrangular shape having a predetermined thickness, and a display part, a receiver part, a key button and the like may be provided on a front surface thereof, and a circuit device and the like may be provided therein. The display part may visually display an operation state, text information and image information and also may include a touchscreen function which is operated in a touching manner. Further, the electronic device 10 may have a power button, a volume adjusting button, an earphone terminal and a connector which are disposed at a side surface thereof. For example, the power button may be provided at a right side surface of the electronic device 10, and the volume adjusting button may be provided at a left side surface thereof opposite to the right side surface thereof. And the earphone terminal may be provided at an upper side surface thereof, and the connector may be provided at lower side surface thereof opposite to the upper side surface thereof. The electronic device 10 may include various functions as well as a voice call function, a video call function and a multimedia function. For example, the electronic device 10 may include a wireless LAN function, a Bluetooth function, a GPS function, an NFC (near field communication) function and so on. Therefore, the circuit device in the electronic device 10 may be provided so as to enable the various functions. If the rear surface cover is removed, a battery may be installed at a predetermined area of the rear surface of the electronic device 10, and an NFC terminal may be exposed, and a camera may be provided. Further, an NFC antenna may be provided inside the rear cover and connected with the NFC terminal.

The body 1000 may be provided so as to be coupled with and separated from the electronic device 10. That is, the body 1000 may be provided to have the same shape as that of the rear surface cover covering the rear surface of the electronic device 10. Of course, the electronic device 10 may be manufactured so that the body 1000 itself is the rear surface cover and is coupled to the rear surface of the electronic device 10. In order to enable the body 1000 to be coupled with and separated from, for example, at least one coupling groove (not shown) may be provided at an edge of the rear surface of the electronic device 10, and at least one coupling protrusion (not shown) may be provided at an area of the body 1000 corresponding to the coupling groove. Therefore, the coupling protrusion of the body 1000 is inserted into the coupling groove of the electronic device 10, and thus the body 1000 may be coupled with the electronic device 10. Meanwhile, the body 1000 may be manufactured to be flexible and thus to be deformed (e.g., bended) within a desired range. To this end, the body 1000 may be made of polyimide PI or polycarbonate PC, or may be made of a metallic material. Of course, the body 1000 may be made of the same material as that of the rear surface cover of the electronic device 10. The polyimide PI is a heat conductive plastic material which has excellent mechanical strength and excellent thermal and chemical stability. The polycarbonate PC is a thermoplastic material which has excellent heat resistance, shock resistance, optical property and workability. Meanwhile, the body 1000 may have a first opening 1100 and the piezoelectric speaker module 2000 may be inserted therein. Of course, the body 1000 may further have a second opening 1200 so that the camera (not shown) installed at the rear surface of the electronic device 10 is exposed. That is, the first opening 1100 enables the piezoelectric speaker module 2000 to be inserted therein, and the second opening 1200 enables the camera to be exposed to the outside. Meanwhile, the NFC antenna may be provided at the body 1000. The NFC antenna may be provided on the piezoelectric speaker module 2000 and may be connected with the NFC terminal. That is, the piezoelectric speaker module 2000 may be provided at a predetermined area of the body 1000, and the NFC antenna may be provided on the piezoelectric speaker module 2000.

The piezoelectric speaker module 2000 may be inserted into the first opening 1100 of the body 1000 and fixed to the predetermined area of the body 1000. For example, the piezoelectric speaker module 2000 may be manufactured to be spaced apart from the vibration transfer member illustrated in FIGS. 1 to 4 in a predetermined distance using the piezoelectric device 100 described in FIGS. 5 to 7. That is, the piezoelectric speaker module 2000 may be manufactured on the basis of the structure described in FIGS. 1 to 4. More specifically, as illustrated in FIG. 11, the piezoelectric speaker module 2000 may include a piezoelectric device 100, a connection terminal 300 which is provided at a predetermined area on the piezoelectric device 100, a bottom vibration transfer case 400 which is as the vibration transfer member at a lower side of the piezoelectric device 100, and a top cover 500 which is provided at an upper side of the piezoelectric device 100. Further, the piezoelectric speaker module 2000 may further include a first adhesive tape (not shown) which adheres the piezoelectric device 100 to the bottom vibration transfer case 400, and a second adhesive tape (not shown) which adheres the piezoelectric device 100 to the top cover 500. Here, the bottom vibration transfer case 400 is provided so as to be spaced apart from a lower surface of the piezoelectric device 100 in a predetermined distance, and also serves as the vibration transfer plate 200 described with reference to FIGS. 1 to 4. However, the bottom vibration transfer case 400 has a different structure from the vibration transfer plate 200, and in order to distinguish it from the top cover 500 based on a position thereof, the terms "bottom vibration transfer case" is used.

The connection terminal 300 is provided at a predetermined area of the piezoelectric device 100 so as to be exposed to the outside. The connection terminal 300 serves to provide a power source and a sound source to the piezoelectric device 100. That is, the connection terminal 300 is connected with an output terminal of the electronic device 10 and provides the power source and the sound source to the piezoelectric device 100. For example, the NFC terminal is exposed through the rear surface of the electronic device 10, and the connection terminal 300 is connected with the NFC terminal. Therefore, the power source and the sound source are received from the electronic device 10 through the NFC terminal and the connection terminal 300, and the piezoelectric speaker module 2000 is driven. For example, a flexible printed circuit board (FPCB) may be used for the connection terminal 300. Meanwhile, a portion of the connection terminal 300 which is exposed to an outside of the piezoelectric speaker module 2000 may be fixedly in close contact with the predetermined area of the body 1000, and a receiving groove may be provided in an area of the body 1000, and the connection terminal 300 may be adhered and fixed to the receiving groove.

The bottom vibration transfer case 400 receives the piezoelectric device 100 and is inserted and coupled to the first opening 1100 of the body 1000. The bottom vibration transfer case 400 includes a base 410, and a coupling part 420 which protrudes upwardly from one surface of the base 410. The base 410 may be provided to be larger than the first opening 1100 of the body 1000 and exposed through the rear surface of the body 1000. Therefore, the base 410 may more protrude than the rear surface of the body 1000. Further, the base 410 may have various shapes such as a quadrangular shape, a circular shape and a polygonal shape. For example, as illustrated in FIG. 11, the base 410 may have an elliptical shape. The base may be made of the same material as that of the body 1000. Further, an inner surface of the base 410 may be defined to be flat or to be curved. That is, the inner surface of the base 410 is spaced apart from the piezoelectric device 100 in a predetermined distance and may be defined to be curved so that a spaced distance is increased from an edge toward a central portion thereof. The coupling part 420 protrudes on the base 410 to have a desired shape and receives the piezoelectric device 100 therein. To this end, the coupling part 420 may have a shape of the piezoelectric device 100 and may protrude upwardly from the base 410. Therefore, a side surface of the piezoelectric device 100 may be fixedly in contact with an inner surface of the coupling part 420. Further, the bottom vibration transfer case 400 may include a stepped portion which is defined inside the coupling part 420 to be higher than the base 420. For example, the stepped portion may be provided inside two opposite side surfaces to be lower than the side surface, and the edge of the piezoelectric device 100 may be attached on the stepped portion through the first adhesive tape. Further, since the piezoelectric device 100 is provided on the stepped portion, a predetermined space is provided between one surface of the piezoelectric device 100 and the bottom vibration transfer case 400 opposite to the one surface of the piezoelectric device 100, i.e., the inner flat surface of the base 410.

The top cover 500 serves to protect the piezoelectric device 100 from external physical force and thus to cover an upper surface of the piezoelectric device 100. That is, the top cover 500 may be attached to an edge of the upper surface of the piezoelectric device 100 through the second adhesive tape. The top cover 500 may be made of a thin board which has a great strength and hardness so as not to be bent well, for example, made of stainless steel or the like. Further, if the top cover 500 is in contact with the upper surface of the piezoelectric device 100, the piezoelectric device 100 may collide with the top cover 500, when the piezoelectric device 100 is vibrated, and vibration of the piezoelectric device 100 may be transmitted to the electronic device 10 through the top cover 500, and thus vibration force of the piezoelectric device 100 may be reduced. In order to prevent the vibration force of the piezoelectric device 100 from being reduced, a cushion material (not shown) may be provided between the piezoelectric device 100 and the top cover 500. That is, the cushion material provided at two edges of the piezoelectric device 100 so that the top cover 500 and the piezoelectric device 100 are maintained in a predetermined distance.

Further, as illustrated in FIG. 13A and FIG. 13B, a cushion material 1300 may be provide at an inner surface of the body 1000 so as to cover the piezoelectric speaker module 2000. A volume space of the piezoelectric speaker module 2000 may be defined by the cushion material 1300, and thus an allophone of the electronic device 10 due to vibration of the piezoelectric speaker module 2000 may be removed. Here, the cushion material 1300 may be made of, for example, a silicon material and may have various shapes, such as a circular shape and a quadrangular shape, so as to cover the piezoelectric speaker module 2000. Further, the cushion materials 1300 may be attached to the body 1000, or may be inserted into a receiving space 1310 defined in the body 1000. That is, first and second partition walls which have a predetermined distance therebetween to cover the piezoelectric speaker module 2000 may be provided and the cushion material 1300 may be inserted between the first and second partition walls. At this time, the cushion material 1300 may be in contact with the rear face of the electronic device 10, and if the cushion material 1300 is too high, the body 1000 may not be coupled to the electronic device 10. Therefore, the cushion material 1300 may have a predetermined height so that the body 100 is easily coupled. When the cushion material 1300 is provided, as illustrated in FIG. 14, the sound pressure is increased at a low frequency band and the resonant frequency is also reduced, compared with a case that the cushion 1300 is not used. That is, FIG. 14 is a graph illustrating the resonant frequency and the sound pressure in the portable piezoelectric speaker A of FIG. 13A and FIG. 13B using the cushion material, and in the portable piezoelectric speaker B of FIG. 9 not using the cushion material. As illustrated in the drawing, The sound pressure in the case A of using the cushion material at a frequency of 0.1 kHz to 1 kHz is 63.0 dB, and the sound pressure in the case B of not using the cushion material is 56.6 dB. Further, the sound pressure in the case A of using the cushion material at a frequency of 1 kHz to 10 kHz is 93.4 dB, and the sound pressure in the case B of not using the cushion material is 91.0 dB. And the sound pressure in the case A of using the cushion material at a frequency of 0.3kHz to 20 kHz is 88.7 dB, and the sound pressure in the case B of not using the cushion material is 84.0 dB. Further, the resonant frequency in the case A of using the cushion material is 1.0 kHz, and the resonant frequency in the case B of not using the cushion material is 1.4 kHz. And the sound pressure at the resonance frequency in the case A of using the cushion material is 95.4 dB, and the sound pressure at the resonance frequency in the case B of not using the cushion material is 94.0 dB.

The portable piezoelectric speaker in accordance with one exemplary embodiment is manufactured so that the piezoelectric speaker module 2000 is inserted into the first opening 1100 defined in the predetermined area of the body 1000. However, an insertion groove (not shown) is provided in a predetermined area of the body 1000, and an insertion protrusion (not shown) is provided at a predetermined area of the piezoelectric speaker module 2000, such that the insertion protrusion is inserted into the insertion groove. To this end, two insertion protrusions are provided on the rear surface of the base 410, and then the insertion protrusions of the piezoelectric speaker module 2000 may be inserted into the insertion groove of the body 1000. At this time, the base 410 may have the same size as the piezoelectric device 100. Further, the body 1000 may not have the first opening 1100, and a receiving space may be provided at a predetermined area of the body 1000, and thus the piezoelectric speaker module 2000 may be inserted and received in the receiving space. That is, a protruding area having the same shape as that of the base 410 and also integrally provided with the body 1000 so as to more protrude than other areas to the outside may be provided, and the receiving space may be provided therein, and the piezoelectric speaker module 2000 may be inserted into the receiving space.

Figure 15:
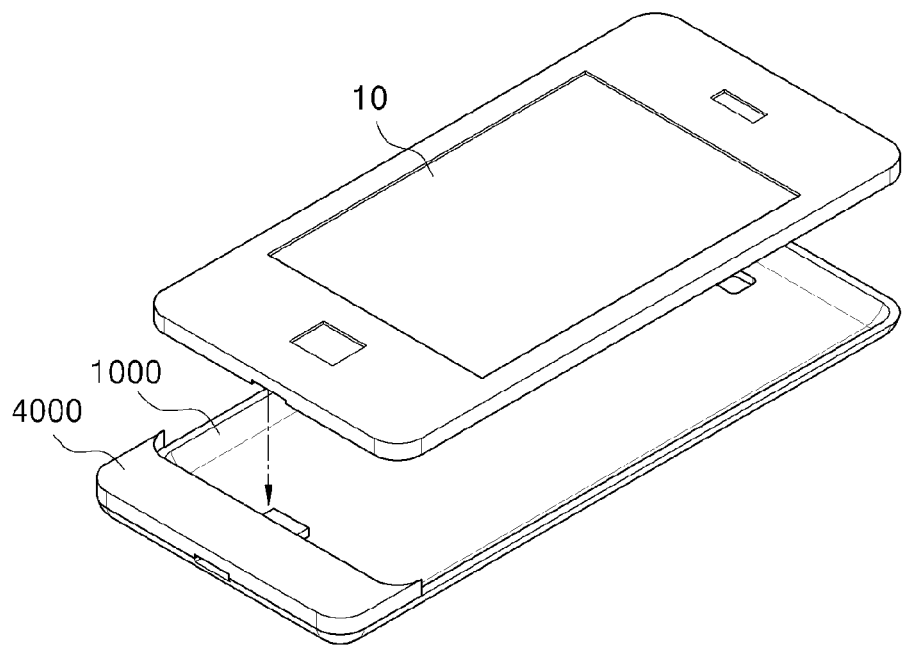
FIGS. 15 to 17 are schematic views of a portable piezoelectric speaker in accordance with another exemplary embodiment.
Figure 16:
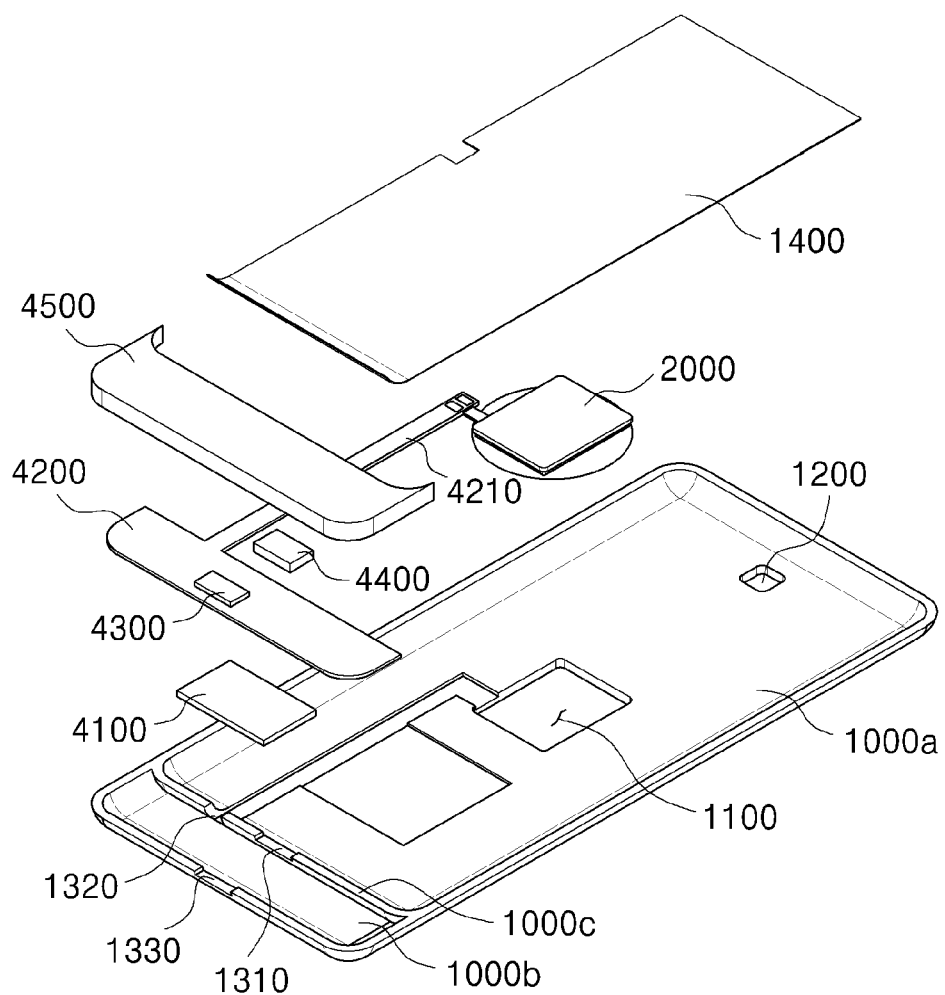
Figure 17:
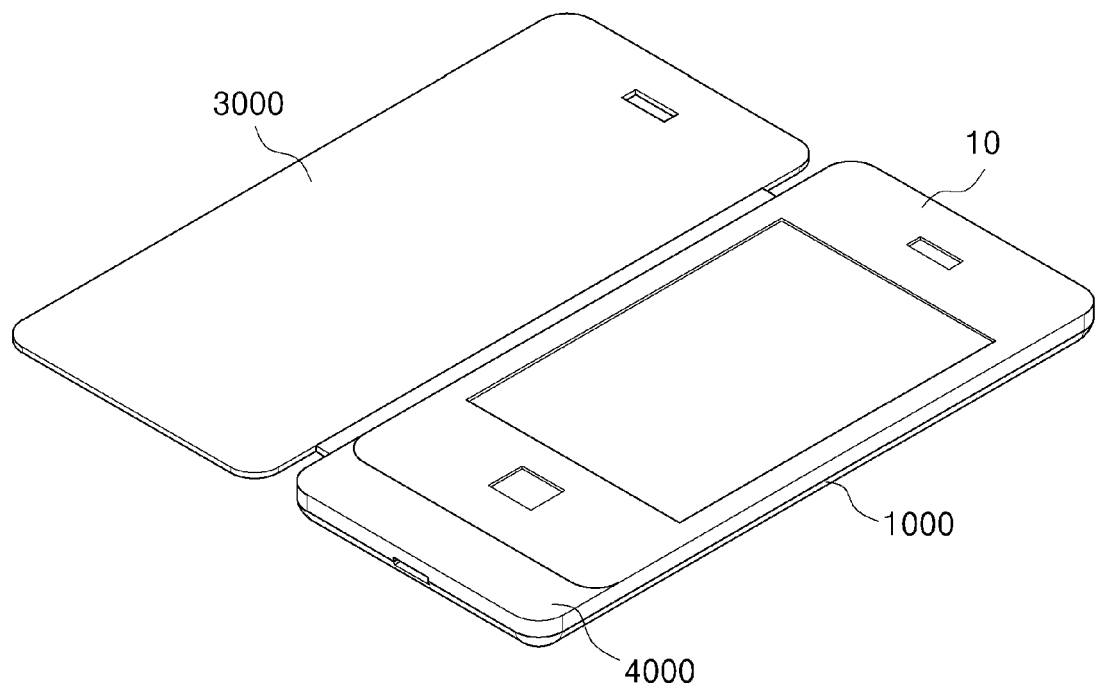

FIGS. 15 to 17 are schematic views of a portable piezoelectric speaker in accordance with another exemplary embodiment. That is, FIGS. 15 and 16 are a schematic view and an exploded perspective view of the portable piezoelectric speaker in accordance with another exemplary embodiment, and FIG. 17 is a schematic view of the portable piezoelectric speaker in accordance with a modified embodiment.

Referring to FIGS. 15 and 16, the portable piezoelectric speaker in accordance with another exemplary embodiment may include a body 1000 which is coupled with the rear surface of the electronic device 10, a piezoelectric speaker module 2000 which is provided at an area of the body 1000 and connected with the electronic device 10, and a power supplying part 4000 which is provided at an area of the body 1000 to supply power to the piezoelectric speaker module 2000. Further, as illustrated in FIG. 17, the portable piezoelectric speaker in accordance with another exemplary embodiment may further include a flip cover 3000 which is capable of covering an entire surface of the electronic device 10 from one side surface of the body 1000. Meanwhile, the piezoelectric speaker module 2000 is already described in the one exemplary embodiment, and thus the description thereof will be omitted.

The body 1000 may include a first area 1000a which corresponds to the rear surface of the electronic device 10, and a second area 1000b which is disposed at a lower side of the first area 1000a so as to provide the power supplying part 4000. That is, in the body 1000, the first area 1000a is provided to have the same size as that of the electronic device 10, and coupled with the rear surface of the electronic device 10, and the second area 1000b may be further provided at the lower side of the first area 1000a corresponding to the lower side of the electronic device 10. At this time, when the rear cover is removed, the electronic device 10 may be coupled to the first area 1000a of the body 1000. That is, like in the one exemplary embodiment, the rear cover of the electronic device 10 is removed, and then the body 1000 is coupled to the rear surface of the electronic device 10. Further, a middle wall 1000c which is higher than a bottom surface of the body 1000 may be provided between the first and second areas 1000a and 1000b. For example, the middle wall 1000c may be provided to have the same height as that of a lower side of the electronic device 10 to which the connector is provided. That is, a plurality of coupling protrusions (not shown) may be provided at an edge of the first area 1000a of the body 1000 and inserted and coupled into a coupling groove (not shown) of the electronic device 10, and the middle wall 1000c may be provided to have the same height as that of a lower surface of the electronic device 10 and thus to be in contact with the lower surface thereof. At this time, for example, the middle wall 1000*c* may have a first groove 1310 which is defined by removing a central portion thereof corresponding to the connector of the electronic device 10 to have the same side as that of the connector. Further, the middle wall 1000*c* may have a second groove 1320 which is defined by removing a predetermined area spaced apart from the central portion to one side so as to have a predetermined size. Meanwhile, the first area 1000*a* of the body 1000 may have a first opening 1100 having a predetermined size, and the piezoelectric speaker module 2000 is inserted. Further, a space in which, for example, the NFX antenna, a DMB antenna and a Bluetooth antenna are installed may be provided at a predetermined region of the first area 1000*a* of the body 1000, for example, at the lower side of the first opening 1100 in which the piezoelectric speaker module 2000 is inserted. The antenna installing space may correspond to a space in which the battery of the electronic device 10 is installed. Meanwhile, an upper cover 1400 which is attached to the first area 1000*a* of the body 1000 so as to cover the first area 1000*a* may be provided. That is, the piezoelectric speaker module 2000, the antenna or the like may be disposed in the first area 1000*a* of the body 1000 so as to be exposed to the outside, and the upper cover 1400 serves to cover the piezoelectric speaker module 2000, the antenna or the like and thus to prevent them from being exposed to the outside. Meanwhile, the upper cover 1400 may be provided to have at least the same size as that of the first area 1000*a*, and a part thereof in which the connection terminal 300 of the piezoelectric speaker module 2000 is connected with the NFC terminal of the electronic device 10 may be removed.

The power supplying part 4000 may be provided at an area of the body 1000 corresponding to the lower side of the electronic device 10. That is, the power supplying part 4000 may be provided at the second area 1000*b* which extends from the first area 1000*a* of the body 100. The power supplying part 4000 is provided so as to supply the power to the piezoelectric speaker module 2000, and may generate and supply the power for driving the piezoelectric speaker module 2000. The power supplying part 4000 may be connected with an external power supplying terminal or an external data supplying terminal. Further, the power supplying part 4000 may be connected with the electronic device 10. That is, the external power supplying terminal or the external data supplying terminal may be connected to one side of the power supplying part 4000, and the electronic device 10 may be connected with other side of the power supplying part 4000. The power supplying part 4000 may include a battery 4100, a circuit board 4200, first and second connectors 4300 and 4400 and a lower cover 4500. The battery 4100 may be charged by power supplied through a power supplying terminal connected with the first connector 4300. The first and second connectors 4300 and 4400 may be provided at an upper side of the circuit board 4300, and the battery 4100 may be connected to a lower side thereof. Further, the first connector 4300 is connected with the external power supplying terminal or data supplying terminal, and the second connector 4400 is connected with the electronic device 10. More specifically, first of all, the second area 1000*b* may have a third groove 1330 which is defined by partially removing a region thereof corresponding to the first groove 1310 of the middle wall 1000*c*. The first connector 4300 is provided to correspond to the third groove 1330, and the second connector 4400 is provided to correspond to the first groove 1310. Here, the first connector 4300 is buried in the power supplying part 4000 so as not to be exposed to the outside, and the second connector 4400 is provided so as to be exposed to the first area 1000*a*. That is, if the battery 4100, the circuit board 4200 and the first and second connectors 4300 and 4400 are provided at the second area 1000*b*, and the lower cover 4500 is covered thereon, the groove in which the first connector 4300 is buried is exposed to the lower side of the power supplying part 4000, and the second connector 4400 protrudes to the upper side of the power supplying part 4000. Further, the first connector 4300 may be provided to have a size in which a power supplying terminal or a data supplying terminal is inserted, and the second connector 4400 may be provided to have a size which is inserted into the connector of the electronic device 10. That is, the power supplying terminal or the data supplying terminal is inserted into the first connector 4300 and the second connector 4400 is inserted into the connector of the electronic device 10 so as to be connected to the circuit board 4200 provided at the lower side of the first and second connectors 4300 and 4400. Further, the battery 4100 may be provided at the lower side of the circuit board 4200, and a connection line 4210 may be provided so as to extend from one side of the circuit board 4200. Therefore, the circuit board 4200 may enable the battery 4100 to be charged by the power supplied through the first connector 4300 and also may enable power of the battery to be supplied to the piezoelectric speaker module 2000 through the connection line 4210. Here, a power amplification circuit may be provided on the circuit board 42000, and the power supplied to the piezoelectric speaker module 2000 may be amplified using the power amplification circuit. That is, the piezoelectric speaker module 2000 may be driven by higher power than the driving power of the electronic device 10, and the power supplying part 4000 may generate and supply the driving power of the piezoelectric speaker module 2000. Further, the connection line 4210 provided at the one side of the circuit board 4200 is connected with the piezoelectric speaker module 2000 provided at the area 1000*a* through the second groove 1320 of the middle wall 1000*c*. meanwhile, since the second connector 4400 is connected with the electronic device 10, it is possible to supply power or data to the electronic device 10 through the first and second connectors 4300 and 4400. Therefore, it is possible to amplify the sound volume and also to charge the battery 4100 using the portable piezoelectric speaker. At this time, when the electronic device 10 is charged, the battery 4100 of the power supplying part 4000 may be charged together, and the piezoelectric speaker module 2000 may be driving by the battery 4100.

The portable piezoelectric speaker in accordance with the exemplary embodiments may be provided so as to be coupled to and separated from the electronic device 10, and may amplify a sound volume supplied from the electronic device 10 using the body 1000 having the same shape as the rear surface of the electronic device 10 as a vibration transfer medium. Further, if the electronic device 10 to which the portable piezoelectric speaker is coupled is in contact with an object, such as a table and a box, through which vibration may be transmitted, it is possible to more amplify the sound volume. At this time, when using the box or the like having the resonant space therein, it is possible to much more amplify the sound volume. Further, in the portable piezoelectric speaker in accordance with the exemplary embodiments, since the piezoelectric speaker module 2000 protrudes more than the body 1000, it is possible to easily transmit the vibration to the object such as the box. The exemplary embodiments may be applied to all of the smart phone, the tablet or the like which requires high sound volume and enhanced sound quality.

Figure 18:
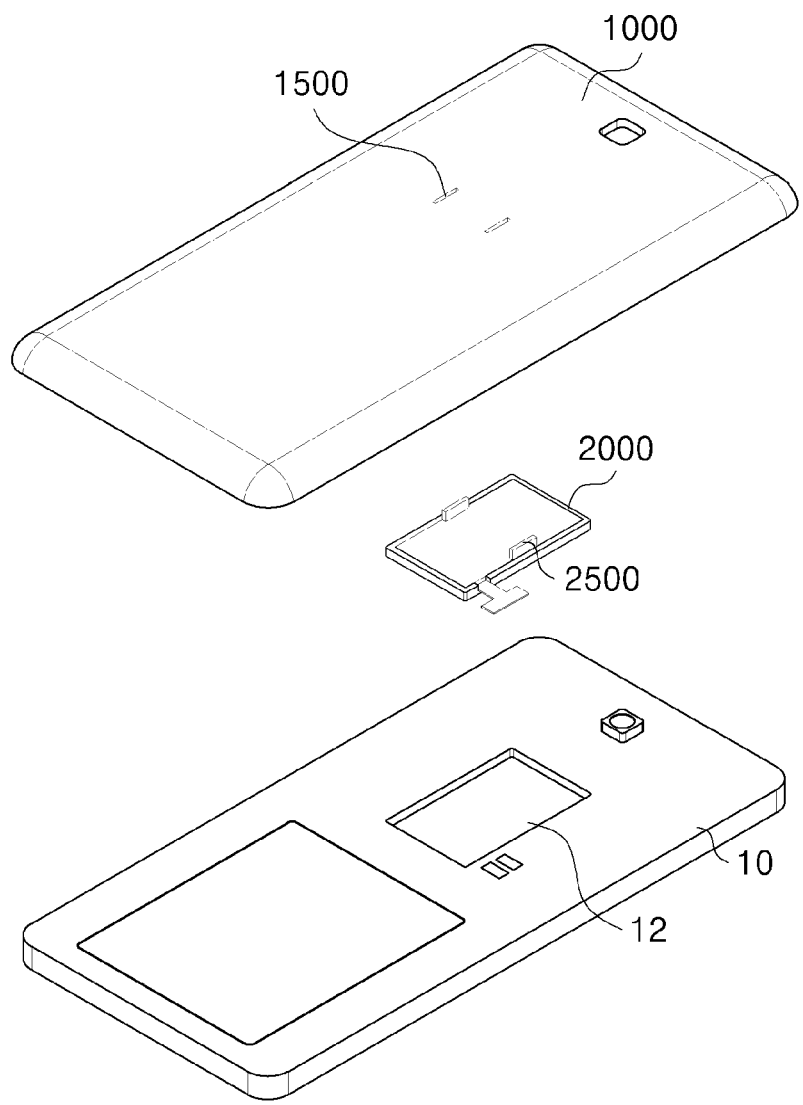
FIGS. 18 to 22B are schematic views of a portable piezoelectric speaker in accordance with yet another exemplary embodiment.

Meanwhile, at least a part of the portable piezoelectric speaker in accordance with the exemplary embodiments is manufactured to have the same shape as the rear surface cover of the electronic device 10, and coupled to the rear surface of the electronic device 10. However, the portable piezoelectric speaker in accordance with the exemplary embodiments may be manufactured to have various shapes and then coupled to the electronic device. That is, as illustrated in FIG. 18, a groove 12 is formed at a predetermined area of the rear surface of the electronic device 10, and the piezoelectric speaker module 2000 may be inserted into the groove 12. At this time, the piezoelectric speaker module 2000 may have a protrusion 2500 protruding in an opposite direction to the electronic device 10 and then may be inserted into a groove 1500 defined in a predetermined area of the body 1000.

Figure 19:
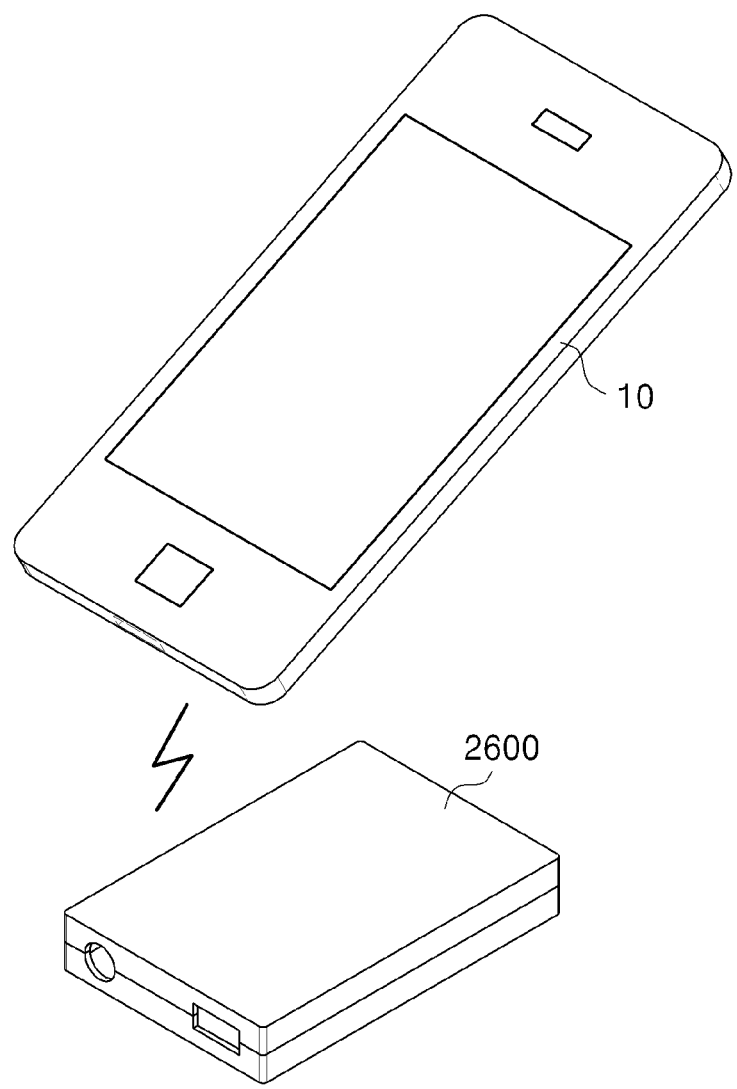
Figure 20:
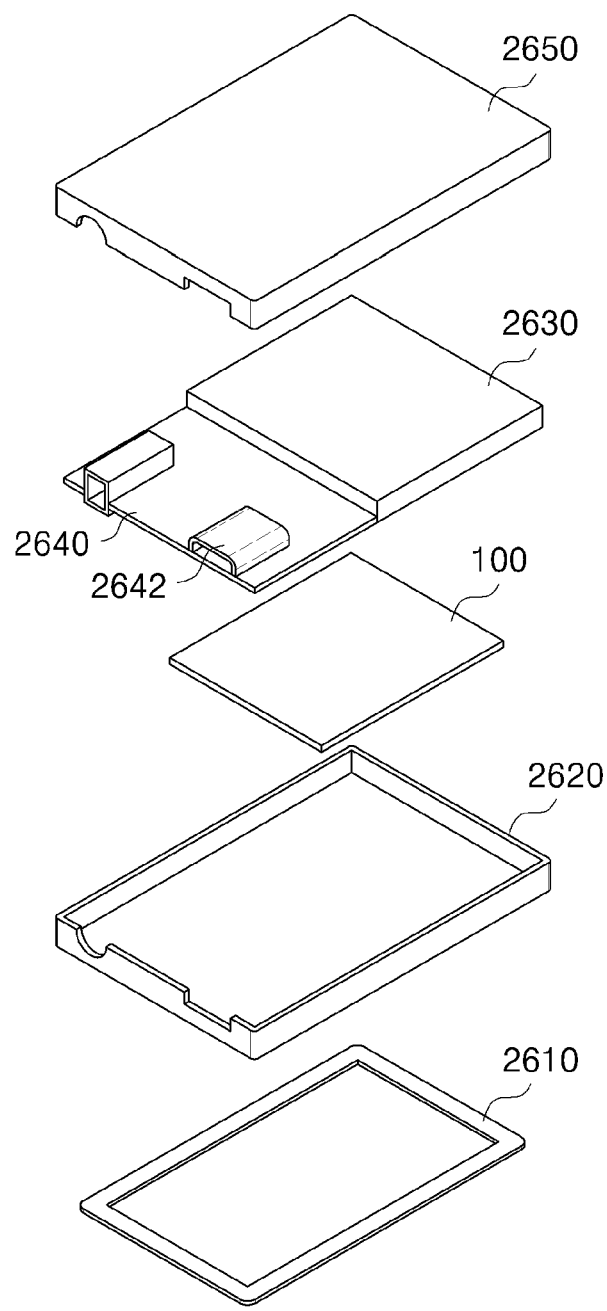

Further, as illustrated in FIG. 19, a portable piezoelectric speaker 2600 may be provided to be spaced apart from the electronic device 10 and may receive a sound source by wireless. Of course, it may be connected with the earphone terminal of the electronic device 10 using a connection line. As illustrated in FIG. 20, the portable piezoelectric speaker 2600 may include a pad 2610, a lower cover 2620, a piezoelectric device 100, a battery 2630, a circuit board 2640 and an upper cover 2650. The lower cover 2620 may have an approximately quadrangular shape in which a predetermined space is defined therein, and may include a bottom surface, and side surfaces which extend upwardly from edges of the bottom surface. At least one of the side surfaces may have at least one groove defined in a predetermined area thereof. The pad 2610 is provided at a lower side of the lower cover 2620. The pad 2610 may be made of a silicon material and may be provided to have a quadrangular ring shape along edges of the lower cover 2620. The pad 2610 serves to enable a predetermined distance to be maintained between an upper surface of an object on which the portable piezoelectric speaker is disposed and the portable piezoelectric speaker. The piezoelectric device 100, the battery 2630 and the circuit board 2640 are provided in an internal space of the lower cover 2620. Here, the piezoelectric device 100 is provided to be spaced apart from the lower cover 2620 in a predetermined distance. For example, a stepped portion may be provided between the bottom surface of the lower cover 2620 and the side surfaces thereof so as to have a height which is lower than the side surfaces, and edges of the piezoelectric device 10 may be adhered and fixed to the stepped portion through an adhesive tape or the like. The battery 2630 is connected with the circuit board 2640 and charged by power supplied from an outside. At least one connector 2642 is provided at an upper side of the circuit board 2640. A power terminal inserted through a groove of the lower cover may be inserted into at least one of the connectors 2642. Further, another one of the connectors 2642 may be connected with the earphone terminal of the electronic device 10 using a connection line or the like. And a power amplification circuit may be provided at the circuit board 2640 so as to amplify the power supplied to the piezoelectric device 100 through the power amplification circuit. That is, it is possible to amplify the power charged in the battery 2630 through the power amplification circuit of the circuit board 2640 and then supply the amplified power to the piezoelectric device 100. The upper cover 2650 may be provided to have the same shape as that of the lower cover 2620, and side surfaces thereof may be air-tightly in contact with the side surfaces of the lower cover so that internal components therein may be air-tightly maintained.

Figure 21:
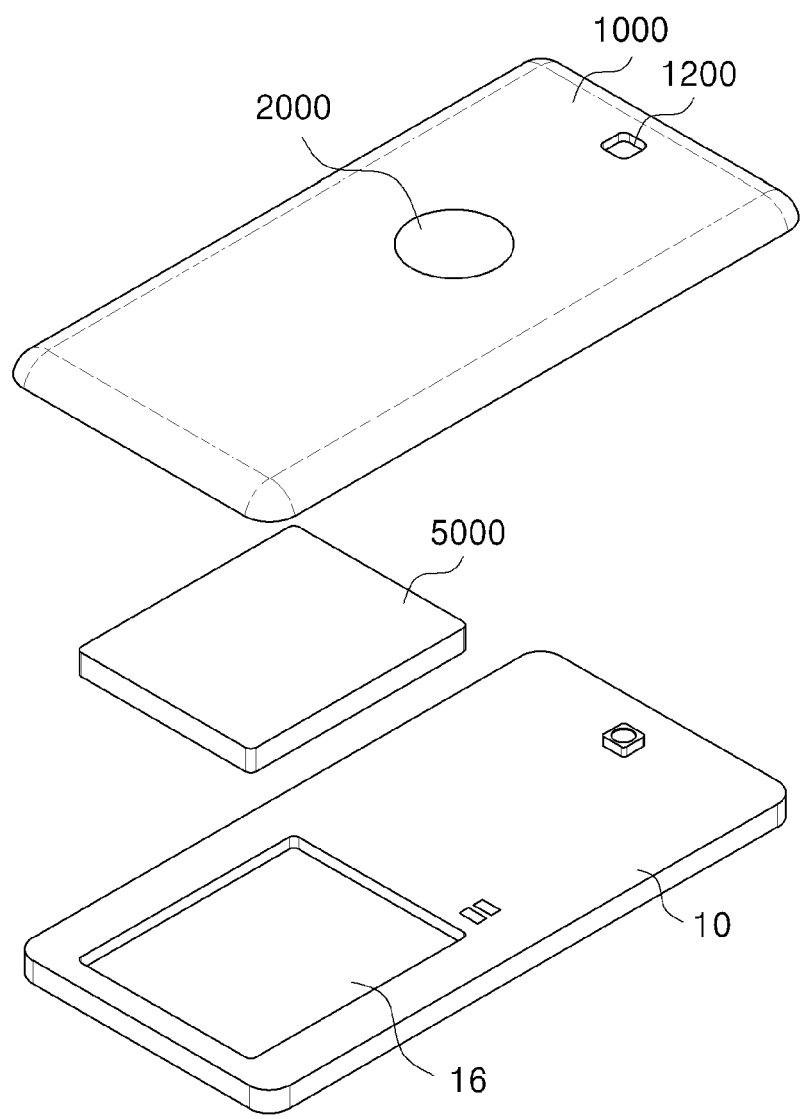
Figure 22A:
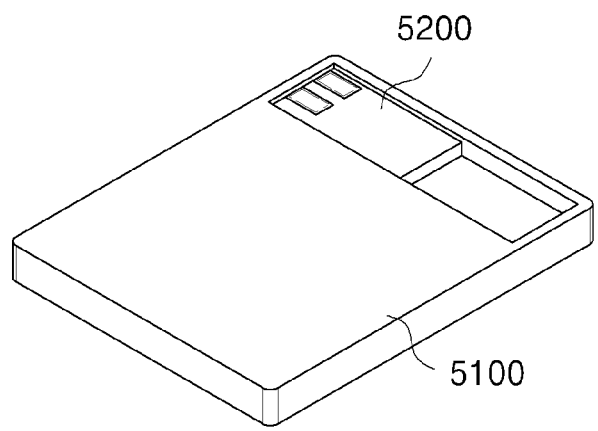
Figure 22B:
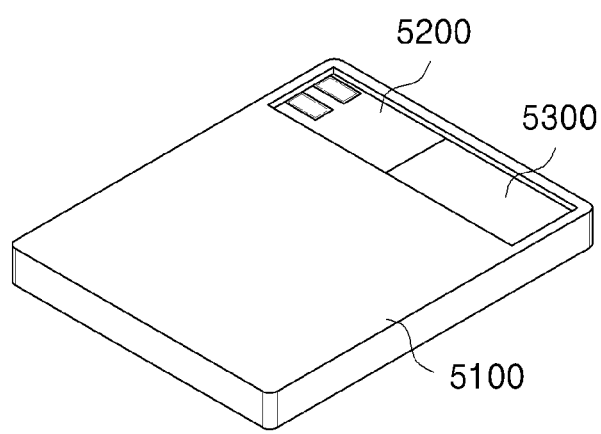
Figure 23:
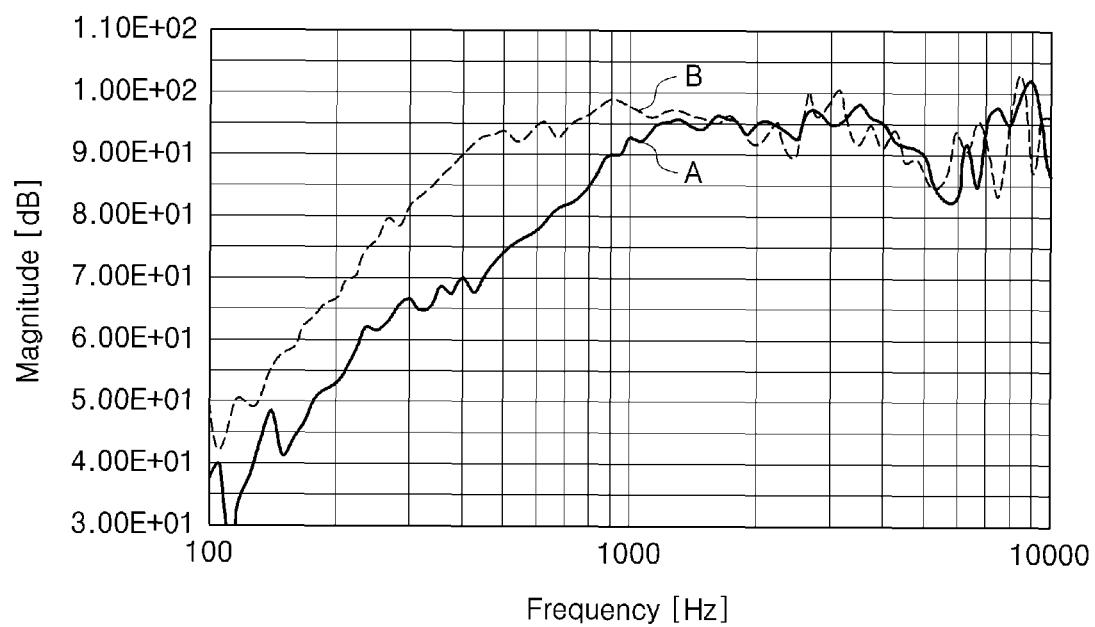
FIG. 23 is a property graph of the portable electronic device equipped with the portable piezoelectric speaker and a case in which the portable electronic device equipped with the portable piezoelectric speaker is in contact with an object in accordance with an exemplary embodiment.

Meanwhile, in the portable piezoelectric speaker in accordance with the exemplary embodiments, the piezoelectric speaker module 2000 provided at the body 1000 may receive power through the battery coupled to the rear surface of the electronic device 10. Further, an amplifying part for amplifying power may be provided in the battery so as to supply amplified power to the piezoelectric speaker module 2000. That is, as illustrated in FIG. 21, in the portable piezoelectric speaker, the body 1000 to which the piezoelectric speaker module 2000 is provided may be coupled to the rear surface of the electronic device 10, and a battery 5100 which supplies power for driving the electronic device 10 and power for driving the piezoelectric speaker module 2000 may be coupled to the electronic device 10. That is, the battery 5100 may be coupled to the electronic device 10, when the portable piezoelectric speaker is driven, and may drive the electronic device 10 and the piezoelectric speaker module 2000, and may be inserted and coupled into a battery receiving groove 16 defined in the rear surface of the electronic device 10. At this time, the electronic device 10 and the piezoelectric speaker module 2000 may be driven by different power sources. For example, the piezoelectric speaker module 2000 may be driven by higher driving power than that of the electronic device 10. Therefore, it is necessary to amplify the power supplied to the piezoelectric speaker module 2000. To this end, as illustrated in FIG. 22A, an amplifying part 5200 may be provided at one side of the battery 5100. The amplifying part 5200 may have a connection terminal and thus may be connected with a connection terminal 300 of the piezoelectric speaker module 2000. Therefore, the piezoelectric speaker module 2000 may be driven by receiving the amplified power through the amplifying part 5200. Further, as illustrated in FIG. 22B, the amplifying part and a Bluetooth module 5300 may be provided at the other side of the battery 5100.

In the portable piezoelectric speaker in accordance with the exemplary embodiments, when the piezoelectric speaker module 2000 is installed at the electronic device 10 and the electronic device 10 is in contact with an object such as a table and a box, it is possible to more increase the resonant frequency and the sound pressure. That is, FIG. 22A and FIG. 22B is a graph comparing characteristics in a case A that the electronic device 10 having the piezoelectric speaker module is not in contact with the object and a case B that the electronic device 10 is in contact with the object. At this time, a box made of paper and having a hexahedral shape of 180 mm×180 mm×50 mm was used as the object. Further, the electronic device 10 which is in contact with the box had a weight of 150 g, and a measuring operation was performed in a distance of 100 mm with a measuring voltage of 5 Vrms. In the case A of being not in contact with the object, the resonance frequency was 1.2 kHz, and in case B of being in contact with the object, the resonance frequency was 0.5 kHz, and thus it could be understood that the resonant frequency was generated in a low frequency.

Figure 24:
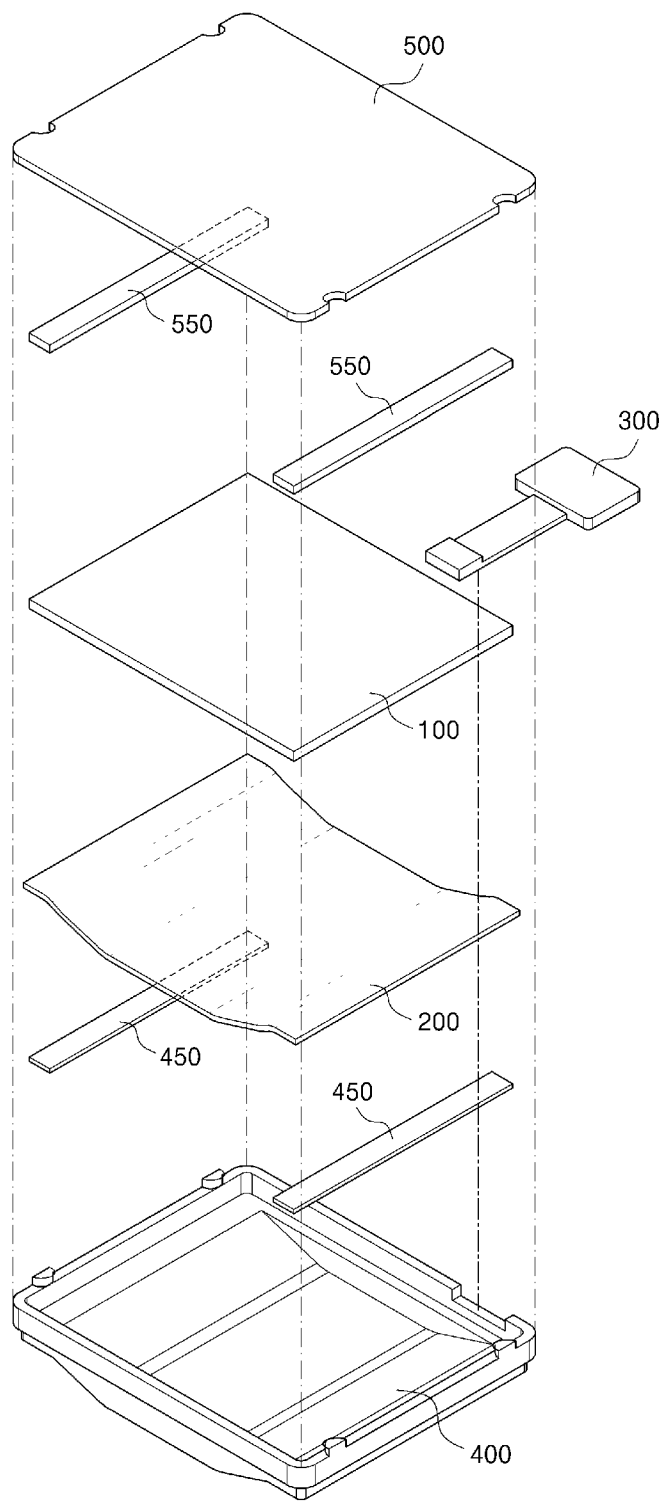
FIGS. 24 and 25 are an exploded perspective view and a coupled cross-sectional view of a piezoelectric speaker module in accordance with another exemplary embodiment.
Figure 25:
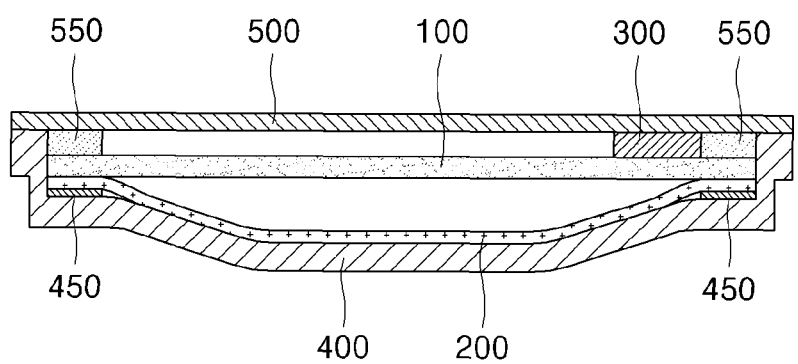

Meanwhile, in the exemplary embodiments, the case in which the piezoelectric speaker module is spaced apart from the piezoelectric device 100 and the bottom vibration transfer case 400 is provided is described. However, the vibration transfer plate 200 may be provided in the bottom vibration transfer case 400. That is, as illustrated in FIGS. 24 and 25, the piezoelectric speaker including the vibration transfer plate 200 provided at least one side of the piezoelectric device 100 so as to be spaced apart from the piezoelectric device 100 may be provided between the bottom vibration transfer case 400 and the top cover 500, and thus may embody the piezoelectric speaker module. Here, the piezoelectric device 200 may be adhered to the bottom vibration transfer case 400 using the adhesive tape 450. Further, if the top cover 500 is in contact with an upper surface of the piezoelectric device 100, the piezoelectric device 100 collides with the top cover 500, while being vibrated, and the vibration of the piezoelectric device 100 is transmitted to the electronic device 10 through the top cover 500, and thus vibration force of the piezoelectric device 100 may be deteriorated. In order to prevent the deterioration of the vibration force of the piezoelectric device 100, a cushion material 550 may be provided between the piezoelectric device and the piezoelectric device 100. That is, the cushion material 550 is provided at two edges of the piezoelectric device 100 so that a desired distance is maintained between the top cover 500 and the piezoelectric device 100.

The portable piezoelectric speaker in accordance with one exemplary embodiment is manufactured so that a body having the same shape as the rear surface cover of the portable electronic device is provided and the piezoelectric speaker module is coupled to a predetermined area of the body. By coupling the body of the portable piezoelectric speaker to the rear surface of the portable electronic device, it is possible to amplify the sound volume of the portable electronic device using the piezoelectric speaker module.

Further, since the exemplary embodiment uses the piezoelectric speaker module, the portable piezoelectric speaker may be manufactured to be very thin and small and thus to easily carry it.

And since the body having the same shape as that of the rear surface cover of the portable electronic device is used as the vibration plate, it is possible to amplify the sound volume. When the portable piezoelectric speaker is in contact with an object such as a table and a box, it is possible to more amplify the sound volume.

Although the portable piezoelectric speaker and the electronic device using the same have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A portable piezoelectric speaker comprising:
   a body coupled to and separated from a rear surface of an electronic device and having an opening defined in a predetermined area thereof;
   a piezoelectric speaker module inserted into and coupled to the opening,
   wherein the piezoelectric speaker module comprises a piezoelectric device; and
   a vibration transfer case in contact with at least one area of the piezoelectric device and spaced apart from at least one surface of the piezoelectric device,
   wherein the vibration transfer case comprises a base spaced apart from one surface of the piezoelectric device, and a coupling part protruding from one surface of the base to one side and accommodating the piezoelectric device therein, and
   wherein the base having a size greater than that of the opening is in contact with a rear surface of the body, the base protruding further than the rear surface of the body.

2. The portable piezoelectric speaker of claim 1, wherein the body has the same shape as that of a rear surface cover of the electronic device and is coupled after the rear cover of the electronic device is separated.

3. The portable piezoelectric speaker of claim 1, wherein the piezoelectric speaker module further comprises a connection terminal of which one side is connected with the piezoelectric device, and the other side is exposed to an outside, and the other side of the connection terminal is connected with an output terminal provided at the rear surface of the electronic device.

4. The portable piezoelectric speaker of claim 3, further comprising an NFC antenna provided on the piezoelectric speaker module.

5. The portable piezoelectric speaker of claim 4, an NFC terminal is further provided at the rear surface of the electronic device, and the NFC antenna is connected with the NFC terminal.

6. The portable piezoelectric speaker of claim 1, further comprises a flip cover provided at one side surface of the body so as to cover a front surface of the electronic device.

7. The portable piezoelectric speaker of claim 1, further comprising a cushion material provided inside the body so as to enclose the piezoelectric speaker module.

8. The portable piezoelectric speaker of claim 1, further comprising a power supplying part provided at one side surface of the body so as to supply power to the piezoelectric speaker module.

9. The portable piezoelectric speaker of claim 8, wherein the power supplying part is provided at a second area which extends in a length direction of the electronic device from a first area of the body coupled with the electronic device.

10. The portable piezoelectric speaker of claimer 8, the power supplying part comprises,
    a first connector connected with an external power terminal,
    a battery charged by power supplied through the first connector,
    a power amplification part configured to amplify power of the battery, and
    a connection line configured to supply power amplified through the power amplification part to the piezoelectric speaker module.

11. The portable piezoelectric speaker of claim 10, further comprising a circuit board provided between the first connector and the battery,
    wherein the power amplification part is provided on the circuit board.

12. The portable piezoelectric speaker of claim 11, further comprising a second connector provided on the circuit board in an opposite direction to the first connector so as to be connected with the electronic device.

13. The portable piezoelectric speaker of claim 8, further comprising a flip cover provided at one side surface so as to cover a front surface of the electronic device and a front surface of the power supplying part.

14. The portable piezoelectric speaker of claim 2, further comprising a battery provided at a predetermined area of the rear surface of the electronic device so as to supply power to the piezoelectric speaker module and the electronic device.

15. The portable piezoelectric speaker of claim 14, further comprising a power amplification part provided at one side of the battery so as to amplify power supplied to the piezoelectric speaker module.

16. The portable piezoelectric speaker of claim 1, wherein the vibration transfer case is provided so that a distance from the piezoelectric device is gradually increased, reduced or uniformly maintained from an edge thereof toward a central portion.

17. The portable piezoelectric speaker of claim 1, wherein the other side of the piezoelectric speaker module is in contact with a vibration amplification objection, and a sound pressure and an output are amplified.

18. An electronic device comprising a piezoelectric speaker module coupled to a rear surface thereof,
   wherein the piezoelectric speaker module comprises a piezoelectric device, and a vibration transfer case which is in contact with at least one area of the piezoelectric device and spaced apart from at least one surface of the piezoelectric device, and
   wherein the vibration transfer case comprises a base spaced apart from one surface of the piezoelectric device, and a coupling part protruding from one surface of the base to one side and accommodating the piezoelectric device therein.

19. The electronic device of claim 18, wherein the vibration transfer case is provided so that a distance from the piezoelectric device is gradually increased, reduced or uniformly maintained from an edge thereof toward a central portion.

20. The electronic device of claim 18, wherein the other side of the piezoelectric speaker module is in contact with a vibration amplification objection, and a sound pressure and an output are amplified.

21. The portable piezoelectric speaker of claim 1, wherein the base has an elliptical shape.

22. The portable piezoelectric speaker of claim 1, wherein an inner surface of the base is curved.

* * * * *